United States Patent
Karabed et al.

[11] Patent Number: 5,809,081
[45] Date of Patent: Sep. 15, 1998

[54] SYSTEM AND METHOD FOR ENCODING DATA SUCH THAT AFTER PRECODING THE DATA HAS A PRE-SELECTED PARITY STRUCTURE

[75] Inventors: Razmik Karabed, San Jose; Nersi Nazari, Cupertino, both of Calif.

[73] Assignee: Mitel Semiconductor Americas Inc., San Jose, Calif.

[21] Appl. No.: 650,700

[22] Filed: May 20, 1996

[51] Int. Cl.$^6$ .............................. H04L 5/12; H04L 23/02
[52] U.S. Cl. ...................... 345/263; 345/265; 371/43.1
[58] Field of Search .................................. 345/263, 265, 345/290, 262, 341; 341/52, 100, 101; 360/40, 39; 371/30, 43.1

[56] References Cited

U.S. PATENT DOCUMENTS

| | | | |
|---|---|---|---|
| 4,831,635 | 5/1989 | Lee et al. | 375/265 |
| 4,888,779 | 12/1989 | Karabed et al. | 371/43 |
| 4,939,555 | 7/1990 | Calderbank | 375/265 |
| 4,941,154 | 7/1990 | Wei | 375/265 |
| 5,095,484 | 3/1992 | Karabed et al. | 371/30 |
| 5,388,124 | 2/1995 | Laroia et al. | 375/290 |
| 5,418,798 | 5/1995 | Wei | 375/265 |
| 5,537,112 | 7/1996 | Tsang | 371/59 |

OTHER PUBLICATIONS

Results of Lexis data search on Jan. 12, 1996.

*Primary Examiner*—Temesghen Ghebretinsae
*Attorney, Agent, or Firm*—Fenwick & West LLP

[57] ABSTRACT

A system comprises an encoder, a precoder, a PR channel, a detector, and a decoder. An input signal is received by the encoder. The encoder generates a code string by adding one or more bits and outputs the code string to the precoder. The encoder applies such encoding such that the code string after being modified by the precoder has a pre-selected parity structure. The encoder provides a systematic encoding scheme in which many of the encoded bits are the same as the input bits used to generate the encoded bits. This systematic approach of the present invention provides an encoder that is easy to implement because a majority of the bits are directly "feed through" and non-trivial logic circuits are only needed to generate the control bits. The systematic encoding also dictates a decoder that is likewise easy to construct and can be implemented in a circuit that simply discards the control bit. The encoder preferably comprises a serial-to-parallel converter, a code generator and a parallel-to-serial converter. The code generator produces one of three trellis codes such as a rate 8/9, 8/10 or 9/11 code. The present invention also includes a method that is directed to encoding bit strings and comprises the steps of: 1) converting the input string to input bits, and 2) adding at least one bit to produce a pre-selected parity structure after precoding.

37 Claims, 14 Drawing Sheets

5,809,081

SYSTEM AND METHOD FOR ENCODING DATA SUCH THAT AFTER PRECODING THE DATA HAS A PRE-SELECTED PARITY STRUCTURE

CROSS-REFERENCE TO RELATED APPLICATIONS

This application relates to U.S. patent application Ser. No. 08/541,675, entitled "System And Method For Coding Partial Response Channels With Noise Predictive Viterbi Detectors," filed Oct. 10, 1995 by Razmik Karabed and Nersi Nazari, which is incorporated herein by reference.

BACKGROUND OF THE INVENTION

1. Field of the Invention

The present invention relates generally to methods for transmission of binary digital data over partial response maximum likelihood (PRML) channels. More particularly, the present invention relates to a novel encoding system and method designed for use with a precoder such that the precoder produces codes with Hamming distance greater than one to eliminate error events with a small distance at the output of the channel. Still more particularly, the present invention relates to an encoding system and method that produces codes which satisfy a set of parity equations when precoded.

2. Description of the Related Art

The use of partial response maximum likelihood (PRML) channels is well known in the art as a method for transmitting data. Prior art methods for coding and detection in PRML channels include: 1) J. K. Wolf and G. Ungerboeck, in "Trellis Coding For Partial-Response Channels," IEEE Trans. Comm., August 1986, pp. 765–773; 2) R. Karabed and P. Siegel disclose one such method in U.S. Pat. No. 4,888,775 entitled "Trellis Codes For Partial-Response Channels," issued Dec. 19, 1989; 3) R. Karabed and P. Siegel in U.S. Pat. No. 4,888,779 entitled "Matched Spectral Null Codes for Partial Response Channels," issued Dec. 19, 1989; 4) R Karabed and N. Nazari, U.S. patent application Ser. No. 08/541,675, entitled "System And Method For Coding Partial Response Channels With Noise Predictive Viterbi Detectors," filed Oct. 10, 1995 which is incorporated herein by reference; and 5) R. Galbraith, U.S. Pat. No. 5,196,849 entitled "Method and Apparatus For Implementing PRML Codes with Maximum Ones," issued Mar. 23, 1993. The prior art methods vary in their performance, or error probability, and also vary in transmission rate.

U.S. patent application Ser. No. 08/541,675, entitled "System And Method For Coding Partial Response Channels With Noise Predictive Viterbi Detectors," discloses the use of codes which preclude error events with small distance at the output of the channel. This approach shows that codes producing a Hamming distance of 2 or more at the input of the channel improve performance, and reduces the error probability. However, this method does not address the situation when a precoder is used.

The prior art often uses precoders to eliminate error propagation. For example, a $1/(1 \oplus D)$ precoder over a 1-D channel produces non-zero channel output for each non-zero precoder input, and produces a zero channel output for each zero precoder input. In magnetic recording, a "1" channel input denotes magnetic polarization in one direction and a "0" channel input denotes magnetic polarization in the opposite direction. If a precoder is not used, then errors persist continually in the system as the magnetic polarization directions are switched. Commonly, a precoder is used to eliminate this problem and exemplary precoders include: a $1/(1 \oplus D)$ precoder for a 1-D channel; a $1/(1 \oplus D)$ precoder for a $(1D)(1+D)^3$ channel; a $1/(1 \oplus D)^2$ precoder for a $1-D^2$ channel; and a $1/(1 \oplus D^4)$ precoder for a $(1-D)^4$ channel. However, such prior art precoding methods do not provide input codes which have hamming distance greater than one for the channel.

Thus, there continues to be a need for methods of encoding signal to provide improved channel performance. In particular, there is a need for a system and method that further improves the performance of partial response channels by using a code generation method that produces codes with a desired parity structure at the output of the precoder.

SUMMARY OF THE INVENTION

The present invention is a system and method for encoding and decoding input strings to improve the performance of partial response channels. The present invention advantageously provides a unique system and method for encoding and decoding binary digital signals such that after precoding the strings will have a predetermined parity structure, and thereby eliminate error events with small distance, and improve overall channel performance. The system of the present invention preferably comprises an encoder, a precoder, a PR channel, a detector, and a decoder. An input signal is received by the encoder. The encoder generates a code string by adding one or more bits and outputs the code string to the precoder. The encoder applies such encoding such that the code string after being modified by the precoder has a pre-selected parity structure. The encoder preferably comprises a serial-to-parallel converter, a code generator and a parallel-to-serial converter. The code generator produces one of three trellis codes such as an 8/9, 8/10 or 9/11 code. The present invention also includes a decoder that is coupled to the output of the detector. The decoder restores a received string to the format that it had at the encoder by performing a function that is the "inverse" of the encoder.

The method of the present invention preferably includes a number of methods. One such method is directed to encoding bit strings and comprises the steps of: 1) converting the input string to input bits, and 2) adding at least one bit to produce a pre-selected parity structure after precoding. Another method is directed to transmitting serial strings and comprises the steps of: 1) encoding an input string by adding at least one bit such that a pre-selected parity structure is produced after precoding, 2) transmitting the encoded signal through a precoder; 3) sending the precoded sequence through a channel to generate a channel output sequence; 4) producing a detector output sequence by applying the channel output sequence to a detector; and 5) decoding the detector output sequence.

The present invention is particularly advantageous over the prior art because it provides a systematic encoding scheme in which many of the encoded bits are the same as the input bits used to generate the encoded bits. This systematic approach of the present invention provides an encoder that is easy to implement because a majority of the bits are directly "feed through" and non-trivial logic circuits are only needed to generate the control bits. The decoder is likewise easy to construct and can be implemented in a circuit that simply discards the control bit.

BRIEF DESCRIPTION OF THE DRAWINGS

The present invention has other advantages and features which will be more readily apparent from the following detailed description of the invention and the appended claims, when taken in conjunction with the accompanying drawings, in which:

DETAILED DESCRIPTION OF THE PREFERRED EMBODIMENT

While the present invention will now be described with reference to a communication system encountered in magnetic recording practice, those skilled in the art will realize that the present invention can be incorporated into any one of a variety of systems for transmitting binary data.

Figure 1:
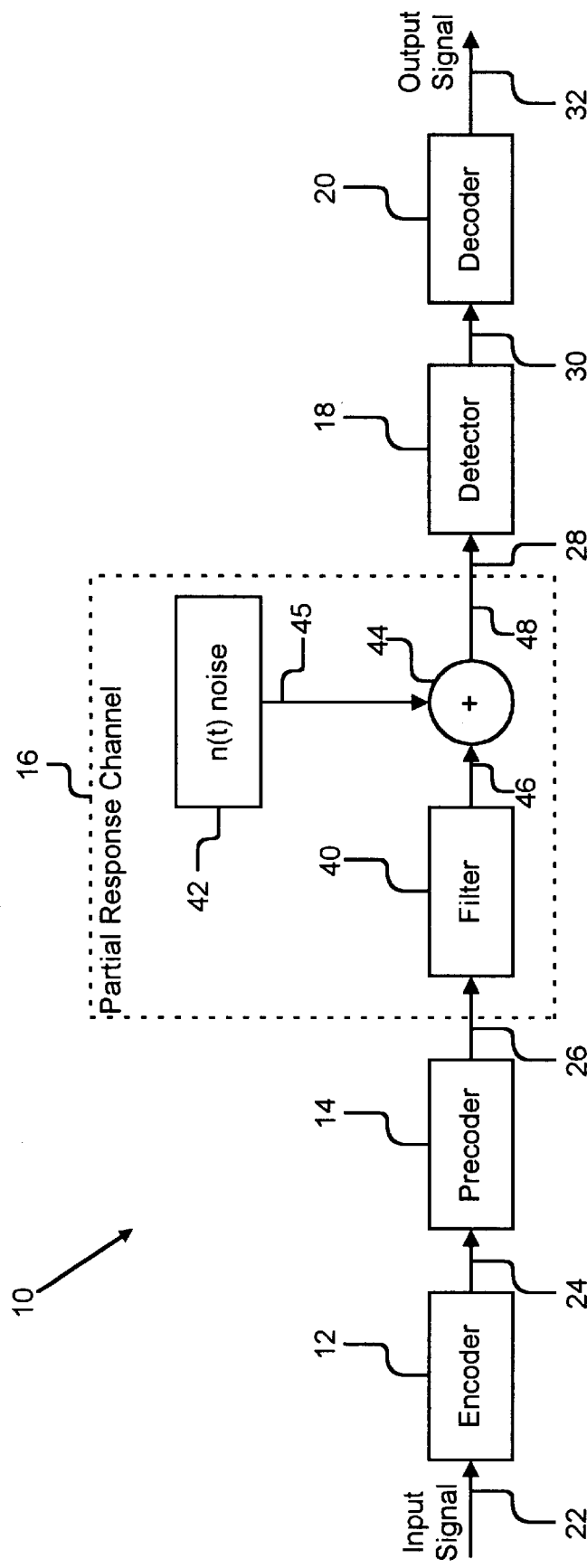
FIG. 1 is a block diagram of a preferred embodiment of a communication system including a partial response channel, an encoder and a decoder constructed according to the present invention.

Referring now to FIG. 1, a preferred embodiment of a communication system 10 constructed in accordance with the present invention is shown. The preferred embodiment of the system 10 comprises an encoder 12, a precoder 14, a partial response (PR) channel 16, a detector 18, and a decoder 20. The PR channel 16 preferably further comprises a low pass filter 40, a noise source 42 and an adder 44. The encoder 12 produces a novel trellis code. The novel trellis code is particularly advantageously because after precoding, the code sequence output by the precoder satisfies a given set of parity equations. More specifically, the pre-selected parity structure improves the performance of the partial response channel 16 by eliminating error events with small distance at the channel output. The present invention preferably provides three trellis codes: code 1, code 2, and code 3. The first code, Code 1, has rate 8/9 and it satisfies one parity equation after preceding by $1/(1 \oplus D^2)$; the parity equation is on all codeword bits after precoding. The second code, Code 2, has rate 8/10 and it satisfies two parity equations after precoding by $1/(1 \oplus D^2)$; one parity equation on the even codeword bits after preceding and one parity equation on the odd codeword bits after precoding. The third code, Code 3, has rate 9/11, and it is a cascaded of two codes, code 3' and code 3". Code 3' is any given rate 9/10 code. Code 3" inserts a bit into each codeword received from code 3' such that the resulting codeword satisfies one parity equation after precoding by $1/(1 \oplus D)$; the parity equation is on all codeword bits after precoding.

As shown in FIG. 1, an input signal on a line 22 is transmitted to an input of the encoder 12. The input signal or data is preferably in the form of a binary symbol string, $b_0, b_1, b_2, \ldots$ The encoder 12 produces and outputs a coded sequence, $v_0, v_1, v_2, \ldots$, from the input signal. The code sequence is preferably one of the above three trellis codes as will be described in more detail below. The preferred embodiments for encoding the input signal are described below with particularity, however, for ease of understanding the remaining components of the system 10 will first be described. The output of the encoder 12 is coupled to line 24 to provide the coded sequence on line 24.

The precoder 14 has an input and an output. The input of the precoder 14 is coupled to line 24 to receive the coded sequence. The precoder 14 generates a precoded sequence $x_0, x_1, x_2 \ldots$, based on the coded sequence. The precoder 14 preferably takes one of two forms, either a $1/(1 \oplus D)$ precoder or a $1/(1 \oplus D^2)$ precoder. Those skilled in the art will realize that the precoder 14 may be any one of a variety of conventional precoders, and for such conventional precoders, the trellis code must be adjusted such that a given set of parity equations are satisfied after encoding and precoding by the encoder 12 and the precoder 14, respectively. If the precoder 14 is $1/(1 \oplus D)$, then the precoded sequence and the code sequence are related by $x_i = v_i \oplus x_{i-1}$. On the other hand, if the precoder 14 is $1/(1 \oplus D^2)$, then they are related as $x_i = v_i \oplus x_{i-2}$. The output of the precoder 14 is coupled to line 26 to provide the precoded sequence $x_0 x_1 x_2 \ldots$, to the PR channel 16.

The preferred embodiment for the PR channel 16 has an input and an output, and further comprises: the filter 40, the noise source 42, and the adder 44. The filter 40 has an input and an output. The input of the filter 40 forms the input of the PR channel 16 and is coupled to line 26 to receive the precoded sequence from the precoder 14. In the preferred embodiment, the filter is either a h (D)=1−D or a h (D)=1−$D^2$ filter. The filter 40 produces a filter output sequence, $y_0 y_1 y_2 \ldots$ If the filter 40 is 1−D, then the channel filter output sequence $y_0 y_1 y_2 \ldots$ and the precoded sequence $x_0 x_1 x_2 \ldots$ are related by $y_i = x_i - x_{i-1}$, but if the channel filter 40 is 1−$D^2$, then the channel filter output sequence $y_0 y_1 y_2 \ldots$ and the precoded sequence $x_0 x_1 x_2 \ldots$ are related by $y_i = x_i - x_{i-2}$. The output of the filter 40 is coupled to line 46 which is in turn coupled to a first input of the adder 44. A second input of the adder 44 is coupled to line 45 to receive a noise signal, n(t), from the noise source 42. The noise source 42 produces a noise sequence $n_0 n_1 n_2 \ldots$, that is output on line 45. The adder 44 adds the noise signal, n(t), and the filter 40 output to produce a channel output sequence, $r_0 r_1 r_2 \ldots$, on line 28. The channel output sequence $r_0 r_1 r_2 \ldots$ is the sum of the channel filter sequence and the noise sequence, i.e., $r_i = y_i + n_i$.

The system 10 also includes the detector 18 having an input and an output. The input of the detector 18 is coupled to line 28 to receive the channel output sequence. The detector 18 is preferably a Viterbi detector, but may also be a noise predictive Viterbi detector or other types of detectors, and generates a detector output sequence, $u_0 u_1 u_2 \ldots$, which is a reproduction of the coded sequence $v_0 v_1 v_2 \ldots$, from the channel output sequence. The detector 18 can be any conventional Viterbi detector. The output of the detector 18 is coupled to line 30 to provide the reproduction of the coded sequence $v_0 v_1 v_2 \ldots$ to the decoder 20.

Finally, the output of the detector 18 is provided on line 30 to the input of the decoder 20. The decoder 20 also performs the inverse of the encoder 12 in order to reproduce the input signal. The output of the decoder is provided on line 32 as an output signal. The decoder 20 generates a decoded sequence $b'_0 b'_1 b'_2 \ldots$ which is a reproduction of the input data. The decoder 20 has several embodiments as will be described in detail below, and the present invention provides an embodiment of the decoder 20 corresponding to each trellis code provided.

Figure 2:
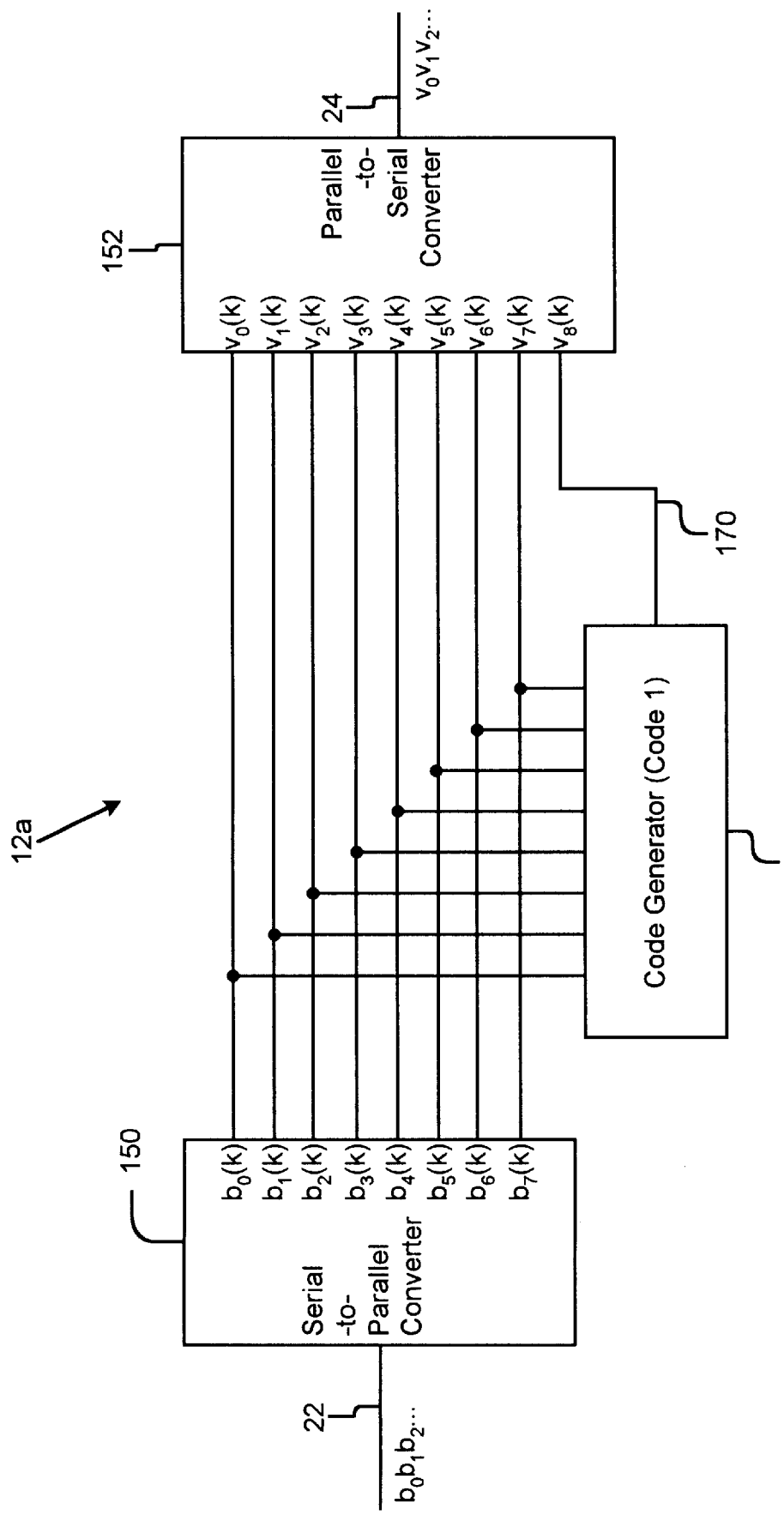
FIG. 2 is a block diagram of a first embodiment of an encoder constructed according to the present invention.

Referring now to FIG. 2, a first embodiment of the encoder 12a of the present invention will be described. In the first embodiment, the encoder 12a performs the encoding using a first code, code 1, that has a rate 8/9 and it satisfies one parity equation after preceding. In this embodiment, the precoder 14 precodes by $1/(1 \oplus D^2)$. The parity equation is preferably on all codeword bits after preceding. The Code 1 encoder 12a takes 8 bits, $b_{8k}, b_{8k+1}, \ldots, b_{8k+7}$, every time $k \geq 0$, and produces 9 bits $v_{9k}, v_{9k+1}, \ldots, v_{9k+8}$. We use the notation $v_i(k)$, $i \in \{0, 1, \ldots, 8\}$, for $v_{9k+i}$, and use $b_i(k)$, $i \in \{0, 1, \ldots, 7\}$, for $b_{8k+i}$. For this code, we desire $$\sum_{m=0}^{8} x_{9k+m} = 0,$$

for every $k \geq 0$, where $x_i$ is the output of a $1/(1 \oplus D^2)$ precoder corresponding to input $v_i$. Lemma 2 and Corollary 2.1 (See Appendix A) are used for n=8 to compute $a_q$, $a^{(e)}(k)$, and $a^{(o)}(k)$, for $q \in \{0, 1, \ldots, 8\}$ as:

$$\begin{bmatrix} q & = & 0\,1\,2\,3\,4\,5\,6\,7\,8 \\ a_q & = & 1\,0\,0\,1\,1\,0\,0\,1\,1 \end{bmatrix}$$

$a^{(e)}(k) = 1$ for even $k$, $a^{(e)}(k) = 0$ for odd $k$, $a^{(o)}(k) = 0$ for even $k$, and $a^{(o)}(k) = 1$ for odd $k$, Therefore, the control integers are 0, 3, 4, 7 and 8, and $T_1(k)$ is:

$$T_1(k) = v_0(k) + v_3(k) + v_4(k) + v_7(k) + v_8(k). \quad (EQ\ 1)$$

Code 1 can be further characterized as:

$(cs_1(k), cs_2(k))$ = Current state at time $k \geq 0$, $(cs_1(0), cs_2(0))$ = Current state at time 0 = $(x_{-2}, x_{-1})$, -continued $(ns_1(k), ns_2(k))$ = Next state at time $k \geq 0$, $$ns_1(k) = cs_1(k) + v_0(k) + v_2(k) + v_4(k) + v_6(k) + v_8(k) \text{ for } k \text{ even}, \quad (EQ\ 2)$$

$ns_1(k) = cs_1(k) + v_1(k) + v_3(k) + v_5(k) + v_7(k)$ for $k$ odd, $ns_2(k) = cs_2(k) + v_0(k) + v_2(k) + v_4(k) + v_6(k) + v_8(k)$ for $k$ odd, $ns_2(k) = cs_2(k) + v_1(k) + v_3(k) + v_5(k) + v_7(k)$ for $k$ even, $\underline{v}$ = Output = $(v_{9k}, v_{9k+1}, \ldots, v_{9k+8})$.

The present invention uses bit 8 as a control integer to force the equation $T_1(k) + a^{(e)}(k)cs_1(k) + a^{(o)}(k)cs_2(k) = 0$, for all $k \geq 0$. Therefore, the output, v, of the code 1 is described by the following equations.

$$v_0(k) = b_0(k), \quad (EQ\ 3)$$

$v_1(k) = b_1(k)$, $v_2(k) = b_2(k)$, $v_3(k) = b_3(k)$, $v_4(k) = b_4(k)$, $v_5(k) = b_5(k)$, $v_6(k) = b_6(k)$, $v_7(k) = b_7(k)$, $v_8(k) = v_0(k) + v_3(k) + v_4(k) + v_7(k) + (a^{(e)}(k)cs_1(k) + a^{(o)}(k)cs_2(k))$.

As shown in FIG. 2, the first embodiment of the encoder 12a includes a serial-to-parallel converter 150, a parallel-to-serial converter 152, and a code generator 154. The serial-to-parallel converter 150 has an input and plurality of outputs, and is preferably a one-to-eight converter. The serial-to-parallel converter 150 receives a serial string having a predetermined number of bits, and provides those bits simultaneously or in parallel at its outputs. The input of the serial-to-parallel converter 150 is coupled to line 22 to receive the binary string $b_0, b_1, b_2, \ldots$ Each of the outputs of the serial-to-parallel converter 150 provides a single bit of the binary string such that eight bits are output. Each of the outputs of the serial-to-parallel converter 150 is coupled to a respective input of the parallel-to-serial converter 152 to generate the bits $v_0$ through $V_7$ according to the above equations. The parallel-to-serial converter 152 preferably has a plurality of inputs (nine) and an output. The parallel-to-serial converter 152 receives a predetermined number of bits in parallel and converts them into a serial string of bits, $v_0, v_1, v_2 \ldots$ The output of the parallel-to-serial converter 152 is coupled to line 24 to provide the encoded sequence. The additional input of the parallel-to-serial converter 152 is coupled to line 170 to receive an additional bit from the code generator 154. The code generator 154 preferably has a plurality of inputs coupled to receive $b_0(k)$ through $b_7(k)$ from the parallel-to-serial converter 152. The code generator 154 produces an additional bit, $b_8(k)$ according to equation 3 above. This additional bit is sent to the parallel-to-serial converter 152 and is used as bit $v_8(k)$. The code generator 154 in the present invention has several embodiment 154a, 154b, 154c, which will be described in more detail below with reference to FIGS. 4–6.

Figure 3:
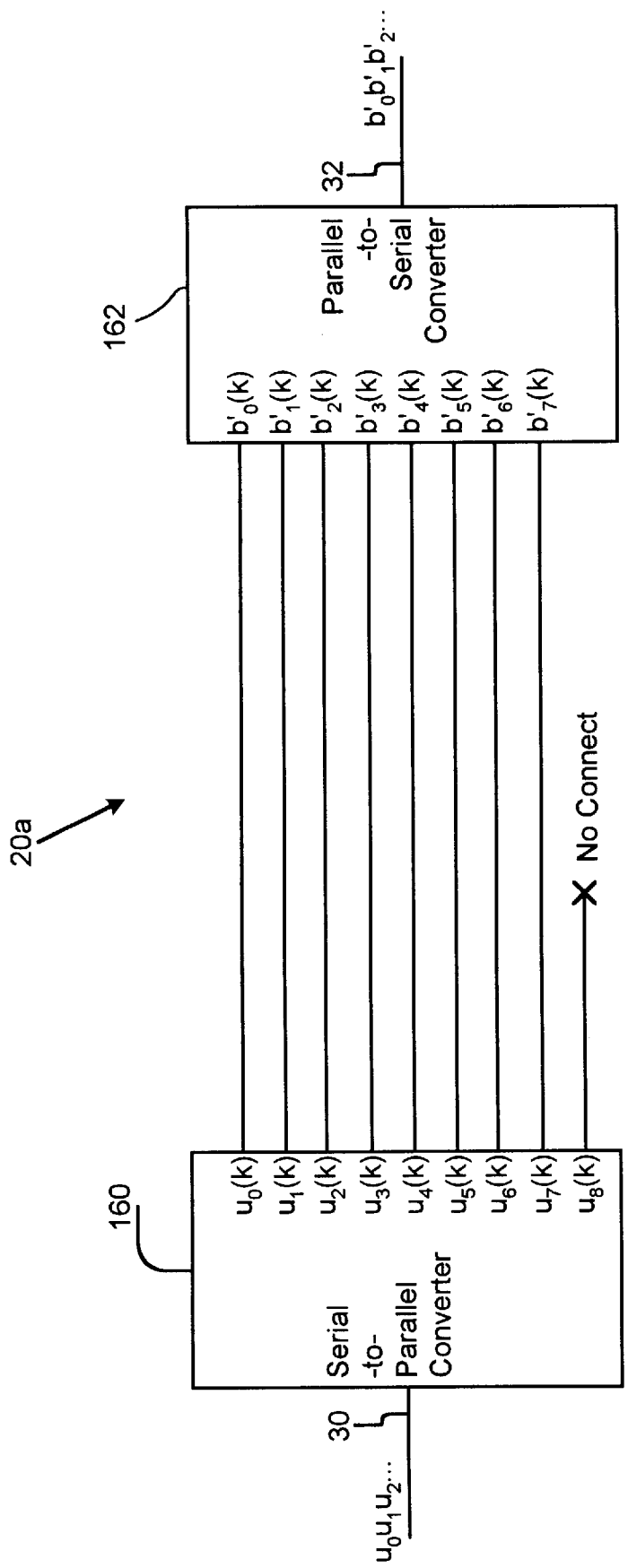
FIG. 3 is a block diagram of first embodiment of a decoder constructed according to the present invention for use in conjunction with the encoder of FIG. 2.

Referring now to FIG. 3, a first embodiment of the decoder 20a constructed according to the present invention for decoding signals encoded with code 1, is shown. The decoder 20a preferably comprises a serial-to-parallel converter 160 and a parallel-to-serial converter 162. The serial-to-parallel converter 160 preferably has an input and nine outputs, and converts an input string into a nine parallel bits. The input of the serial-to-parallel converter 160 is coupled to line 30 to receive the sequence output by the detector 18. The parallel-to-serial converter 162 preferably has eight inputs and an output, and converts the eight input parallel bits into a string. The output of the parallel-to-serial converter 162 is coupled to line 32 to provide the reconstructed input string. Eight of the nine outputs, $u_0(k)$ through $u_7(k)$ of the serial-to-parallel converter 160 are coupled to respective inputs of the parallel-to-serial converter 162. The ninth output, $u_8(k)$, is not coupled to any input of the parallel-to-serial converter 162, thereby effectively dropping this bit from the sequence and decoding the bit stream from nine bits to eight bits, the original format for the string.

While the encoder 12a and the decoder 20a have and will be described as including a serial-to-parallel converters and parallel-to-serial converters, those skilled in the art will realize that the present invention may be constructed without use of such converters. Since the control bit is assigned to one of the bits for each code, an alternate embodiment of the encoder does not require the converters. As bits enter into the alternate embodiment of the encoder, they simply pass through except at time instances where a control bit needs to be inserted. At such an instance, the input stream is stopped (via such a method as clock gapping) and the control bit is computed and inserted at the output of the encoder.

Figure 4A:
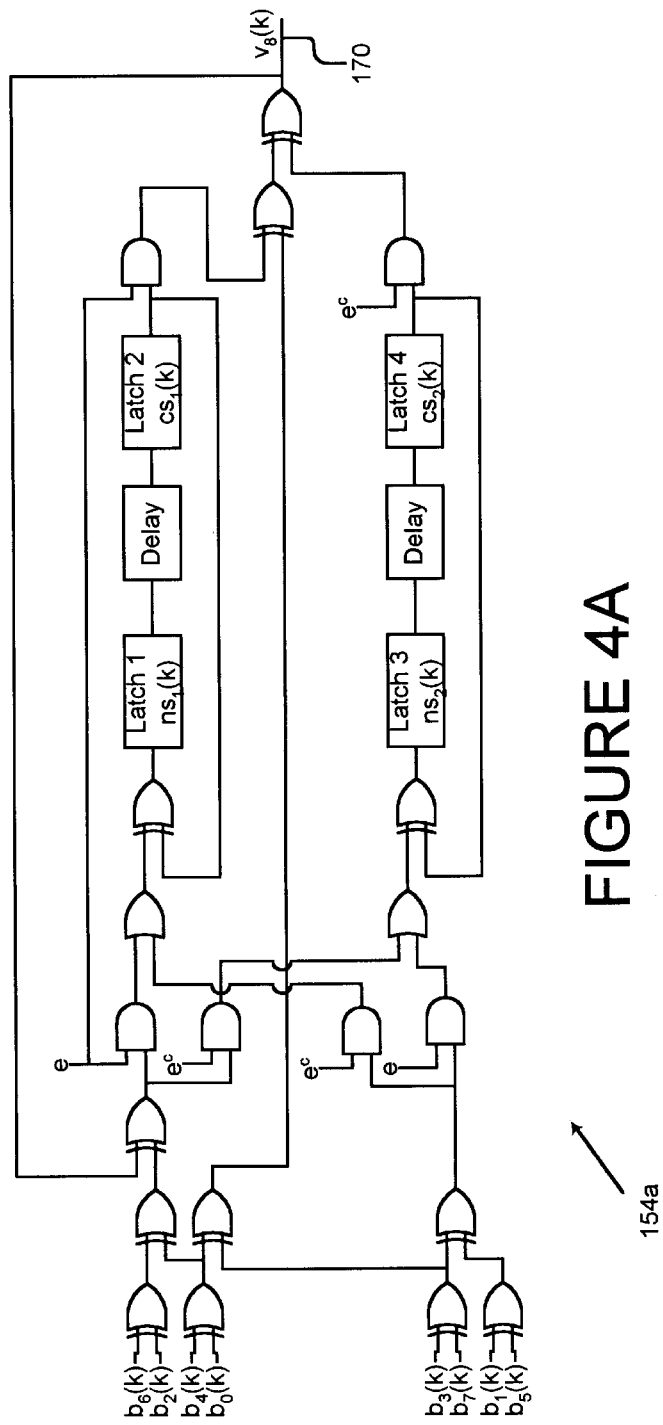
FIGS. 4A and 4B are block diagrams of a first embodiment of a code generator used in the first embodiment of the encoder and constructed according to the present invention to generate a first code.
Figure 4B:
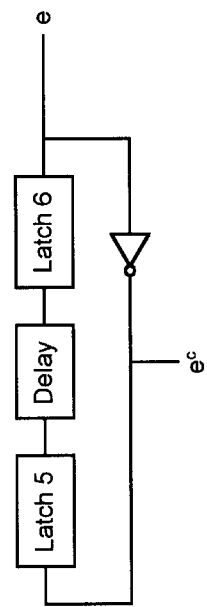

Referring now to FIGS. 4A and 4B, a first embodiment for the code generator 154a that generates the additional bit of code 1 is shown. The first embodiment for the code generator 154a comprises combinational logic, a plurality of latches, and delays as shown in FIG. 4A, and implements the equation 3 in hardware. The series of a first latch, a delay and a second latch that are used to store a first current and next states. The even bits are Exclusive-ORed together, the odd bits are Exclusive-ORed together, then ANDed with the e and $e^c$ signals, respectively, before being applied to the input of the first latch. The input to the first latch also receives a current state feedback component from latch 2. A second series of a third latch, a delay and a fourth latch are similarly coupled and store a second current and next states. The input to the third latch is provided by an output of an Exclusive-OR gate that receives the output of the fourth latch and the results Exclusive-ORing the even bits together, and Exclusive-ORing the odd bits together, and then ANDing the output with the $e^c$ and e, respectively. The output of each series of latches is again ANDed with e and $e^e$ signals, respectively, before being combined using Exclusive-OR gates to provide the generator 154a output on line 170. As shown in FIG. 4B, the e and $e^c$ signals are produced from a serial coupling of a fifth latch, a delay and a sixth latch. The output of the sixth latch provides the e signal and is also inverted to provide the $e^c$ signals which is fed back as the input to the fifth latch. In the preferred embodiment, the initial state of the second latch is $cs_1(0)=x_{-2}$, the initial state of the fourth latch is $Cs_2(0)=x_{-1}$, and the initial state of the sixth latch is a $a^{(e)}(0)=1$.

Figure 5:
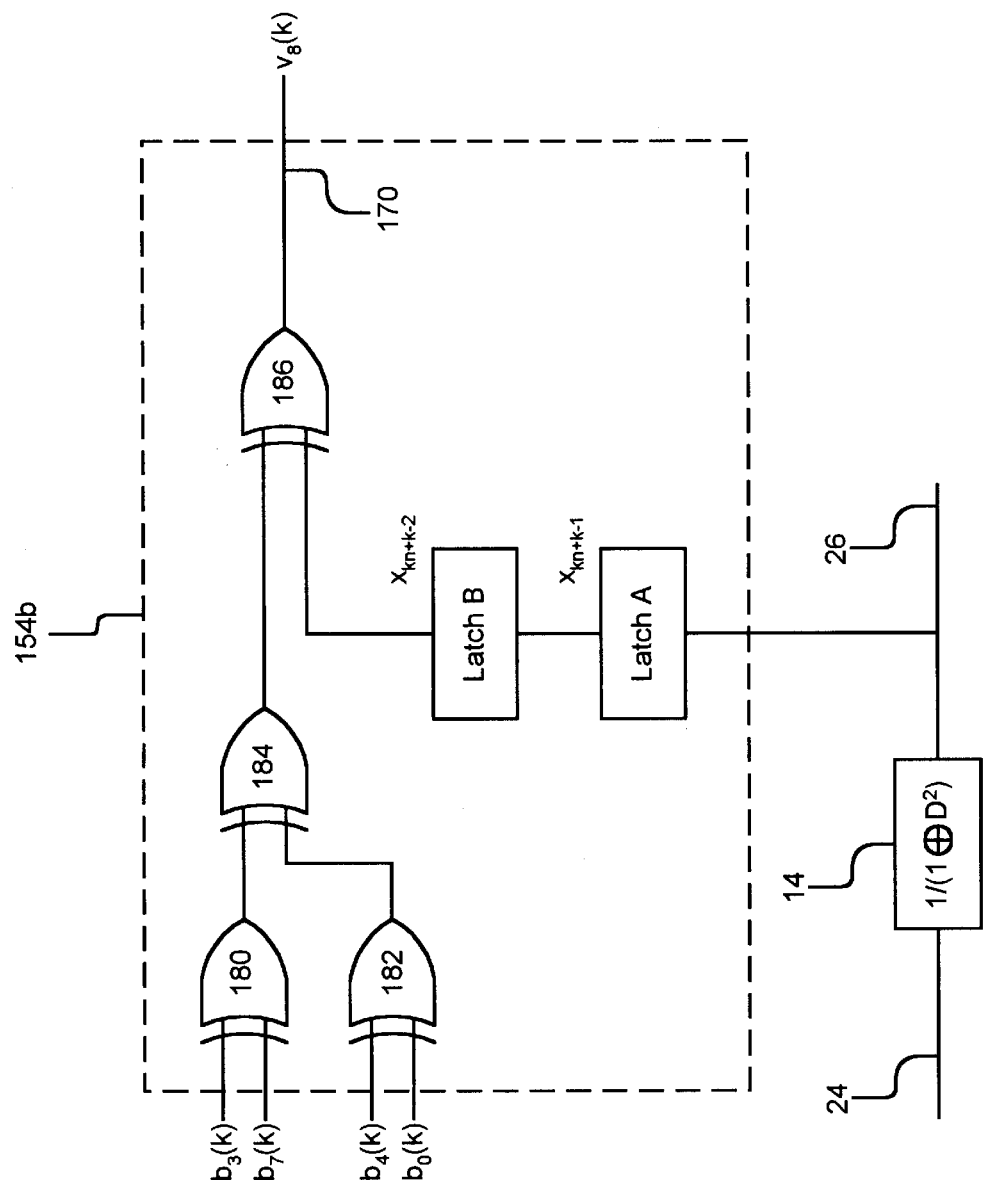
FIG. 5 is block diagram of a second embodiment of the code generator used in the first embodiment of the encoder of the present invention to generate a first code.

Referring now to FIG. 5, a second embodiment of the code generator 154b for the first code, code 1, is shown. The second embodiment of the code generator 154b is shown in FIG. 5, and is based on the same equation as the embodiment 154a of FIGS. 4A and 4b, and the equation can be rewritten as $T_1(k)+h^{(e)}x_{kn+k-2}+h^{(o)}x_{kn+k+1}=0$. Therefore, using equation (EQ 1), $v_8(k)$ can be written as $$v_8(k)=v_0(k)+v_3(k)+v_4(k)+v_7(k).+(h^{(e)}x_{kn+k-2}+h^{(o)}x_{kn+k-1}) \quad \text{(EQ4)}$$

However, $h^{(e)}=1$ and $h^{(o)}=0$, thus equation (EQ 4) simplifies to $$v_8(k)=v_0(k)+v_3(k)+v_4(k)+v_7(k)+x_{kn+k-2}. \quad \text{(EQ5)}$$

The second embodiment of the code 1 code generator 154b is based on (EQ 5). As shown in FIG. 5, the code generator 154b includes four Exclusive-OR gates a first latch and a second latch. A first Exclusive-OR gate 180 receives the $b_3(k)$ and the $b_7(k)$ signals, and a second Exclusive-OR gate 182 receives the $b_4(k)$ and the $b_0(k)$ signals. The output of the first and second Exclusive-OR gates 180, 182 are provided as the inputs to the third Exclusive-OR gate 184 which in turn is input to Exclusive-OR gate 186. The output of Exclusive-OR gate 186 provides the output of the second embodiment of the code generator 154b and is coupled to line 170. The other input of the Exclusive-OR gate 186 is coupled to the output of latch B to provide a signal equal to $x_{kn+k-2}$. The first and second latches are coupled in series and the input to the first latch, latch A is the output of precoder 14 on line 26. The second embodiment of the code generator is particularly advantageous because feedback from the precoder 14 is used to minimize the gate used in the code generator 154b.

Figure 6:
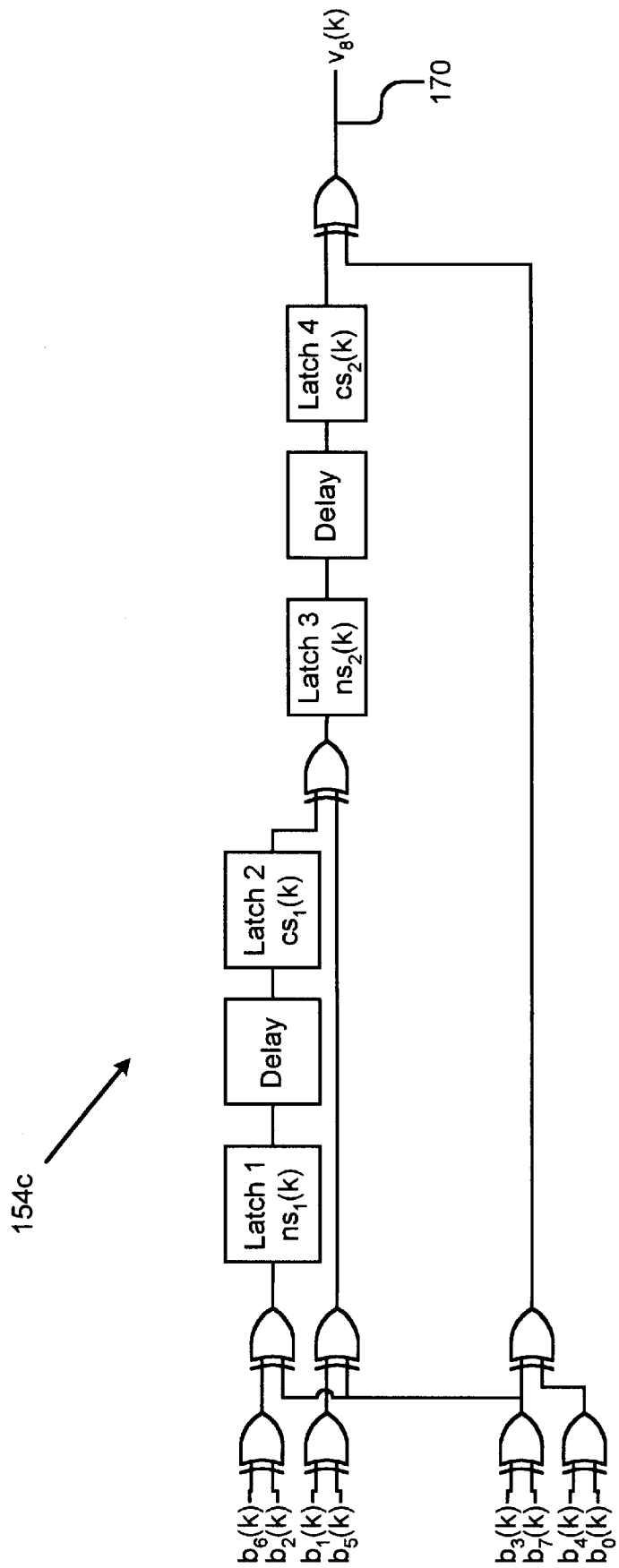
FIG. 6 is block diagram of a third embodiment of the code generator used in the first embodiment of the encoder of the present invention to generate a first code.

Referring now to FIG. 6, a third embodiment of the code generator 154c for code 1 is shown. The third embodiment of the code generator 154c shown in FIG. 6 is based on is based on Corollary 2.7 (See Appendix A), which describes a finite state machine characterized by $$cs(0) = (cs_1(0), cs_2(0)) = ([r_1x_{-1} + r_2x_{-2}]_2, [r_1x_{-2} + r_2x_{-1}]_2),$$

$$cs(k) = (ns_1(k-1), ns_2(k-1)) \text{ for } k > 0,$$

$$ns(k) = (ns_1(k), ns_2(k)) \text{ for } k \geq 0,$$

$$ns_1(k) = cs_2(k) + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}'$$

$$ns_2(k) = cs_1(k) + r_1 \sum_{\substack{t \in \{0,\ldots,n\} \\ t \text{ odd}}} v_{kn+k+t} + r_2 \sum_{\substack{t \in \{0,\ldots,n\} \\ t \text{ even}}} v_{kn+k+t}'$$

$$\underline{v} = \text{Output} = (v_{kn+k}, v_{kn+k+1}, \ldots, v_{kn+k+n}).$$

Now, we use the following expression for $ns_2(k)$ given in Corollary 2.7.

$$ns_1(k) = T_1(k) + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}'$$

$r_1$ and $r_2$ are 5 and 4, respectively, however, we place a one for $r_1$ and a zero for $r_2$, since arithmetic is mod 2. FIG. 6 shows the third embodiment of code 1 code generator 154c. As can be seen, the third embodiment is similar to the first embodiment, but simplified, and comprises a plurality of Exclusive-OR gates and a first and second series of latches and delays. The signals $b_6(k)$, $b_2(k)$, $b_3(k)$ and $b_7(k)$ are Exclusive-ORed and input to the first latch. The signals $b_1(k)$, $b_5(k)$, $b_3(k)$ and $b_7(k)$ are Exclusive-ORed with output of the second latch, and then input to the third latch. Finally, the signals $b_4(k)$, $b_0(k)$, $b_3(k)$ and $b_7(k)$ are Exclusive-ORed with output of the fourth latch, and provide the output of the third embodiment of the code generator 154b on line 170. The initial state of latch 4 is $cs_2(0)=r_2x_{-1}+r_1x_{-2}=x_{-2}$, and the initial state of latch 2 also is $cs_1(0)=r_2x_{-1}+r_1x_{-2}=x_{-2}$ Referring now to FIGS. 7–10, a second embodiment of the system 10 will be described. In the second embodiment of the system 10, the system has an encoder 12b and a decoder 20b that are very similar to the first embodiment except that the encoder 12b has a different encoding scheme, namely code 2. Code 2 is a rate 8/10 code and it satisfies two parity equations after precoding by $1/(1\oplus D^2)$—one parity equation on the even codeword bits after precoding and one parity equation on the odd codeword bits after precoding. The Code 2 encoder 12b takes 8 bits, $b_{8k}, b_{8k+1}, \ldots, b_{8k+7}$, every time $k \leq 0$, and produces 10 bits, $v_{10k}, v_{10k+1}, \ldots, v_{10k+9}$. The notation used is $v_i(k)$, $i \in \{0, 1, \ldots, 9\}$, for $v_{10k+i}$, and $b_i(k)$, $i \in \{0, 1, \ldots, 7\}$, for $b_{8k+i}$.

For this second code, it is desirable that:

$$C1: \sum_{m=0}^{4} x_{10k+2m} = 0,$$

and $$C2: \sum_{m=0}^{4} x_{10k+2m+1} = 0$$

for every $k \geq 0$, where $x_i$ is the output of a $1/(1\oplus D^2)$ precoder corresponding to input $v_i$.

The equations C1 and C2 are independent, therefore, using Lemma 3, we apply Lemma 2 twice, once for each of the parity equations C1 and C2. Applying Lemma 2 to C1 for $n=9$, we compute $a_q^{(1)}$, $a^{(e)(1)}(k)$, and $a^{(o)(1)}(k)$, for $q \in \{0, 1, \ldots, 9\}$ are computed to have values:

$$\begin{bmatrix} q & = & 0\ 1\ 2\ 3\ 4\ 5\ 6\ 7\ 8\ 9 \\ a_q^{(1)} & = & 1\ 0\ 0\ 0\ 1\ 0\ 0\ 0\ 1\ 0 \end{bmatrix}$$

$a^{(e)(1)}(k) = 1$ for all $k$, and $a^{(o)(1)}(k) = 0$ for all $k$.

Therefore, the control integers are 0, 4, and 8, and $T_1^{(1)}(k)$ is $$T_1^{(1)}(k) = v_0(k) + v_4(k) + v_8(k). \quad (EQ\ 6)$$

Using Corollary 2.2 (See Appendix A) t, we obtain $(cs_1^{(1)}(k), cs_2^{(1)}(k))$ = Current state for C1 at time $k \geq 0$, (EQ 7)

$(cs_1^{(1)}(0), cs_2^{(1)}(0))$ = Current state for C1 at time $0 = (x_{-2}, x_{-1})$, $(ns_1^{(1)}(k), ns_2^{(1)}(k))$ = Next state for C1 at time $k \geq 0$, $ns_1^{(1)}(k) = cs_1^{(1)}(k) + v_0(k) + v_2(k) + v_4(k) + v_6(k) + v_8(k)$, $ns_2^{(1)}(k) = cs_2^{(1)}(k) + v_1(k) + v_3(k) + v_5(k) + v_7(k) + v_9(k)$, and $\underline{v}$ = Output = $(v_{10k}, v_{10k+1}, \ldots, v_{10k+9})$.

For C1, the control integer (0, 4 or 8) is chosen to force the ($p^3$) equation $$T_1^{(1)}(k) + a^{(e)(1)}(k)cs_1^{(1)}(k) + a^{(o)(1)}(k)cs_2^{(1)}(k) = 0. \quad (EQ\ 8)$$

Using the values derived using lemma 2 above, we can simplify (EQ 8).

$$T_1^{(1)}(k) + cs_1^{(1)}(k) = 0 \quad (EQ\ 9)$$

Applying Lemma 2 to C2, $a_q^{(2)}, a^{(e)(2)}(k)$, and $a^{(o)(2)}(k)$, for $q \in \{0, 1, \ldots, 9\}$, are computed to have the following values:

$$\begin{bmatrix} q & = & 0\ 1\ 2\ 3\ 4\ 5\ 6\ 7\ 8\ 9 \\ a_q^{(1)} & = & 0\ 1\ 0\ 0\ 0\ 1\ 0\ 0\ 0\ 1 \end{bmatrix}$$

$a^{(e)(2)}(k) = 0$ for all $k$, and $a^{(o)(2)}(k) = 1$ for all $k$.

Therefore, the control integers are 1, 5, and 9, and $T_1^{(2)}(k)$ is $$T_1^{(2)}(k) = v_1(k) + v_5(k) + v_9(k) \quad (EQ\ 10)$$

Again using Corollary 2.2, we obtain $(cs_1^{(2)}(k), cs_2^{(2)}(k))$ = Current state for C2 at time $k \geq 0$, (EQ 11)

$(cs_1^{(2)}(0), cs_2^{(2)}(0))$ = Current state for C2 at time $0 = (x_{-2}, x_{-1})$, $(ns_1^{(2)}(k), ns_2^{(2)}(k))$ = Next state for C2 at time $k \geq 0$, $ns_1^{(2)}(k) = cs_1^{(2)}(k) + v_0(k) + v_2(k) + v_4(k) + v_6(k) + v_8(k)$, $ns_2^{(2)}(k) = cs_2^{(2)}(k) + v_1(k) + v_3(k) + v_5(k) + v_7(k) + v_9(k)$, and $\underline{v}$ = Output = $(v_{10k}, v_{10k+1}, \ldots, v_{10k+9})$.

C2 control integer (1, 5 or 9) is chosen to force the ($p^3$) equation $$T_1^{(2)}(k) + a^{(e)(2)}(k)cs_1^{(2)}(k) + a^{(o)(2)}(k)cs_2^{(2)}(k) = 0. \quad (EQ\ 12)$$

And equation 12 is simplified to:

$$T^{(2)}1(k) + cs_2^{(2)}(k) = 0. \quad (EQ\ 13)$$

The present invention preferably used bit 8 as a control integer for C1, to force (EQ 9), and bit 9 is used as a control integer for C2, to force (EQ13), for all $k \geq 0$. Therefore, the output, v, of the code 2 encoder 12b is described by the following equations.

$v_0(k) = b_0(k)$, $v_1(k) = b_1(k)$, $v_2(k) = b_2(k)$, $v_3(k) = b_3(k)$, $v_4(k) = b_4(k)$, $v_5(k) = b_5(k)$, $v_6(k) = b_6(k)$, $v_7(k) = b_7(k)$, $v_8(k) = v_0(k) + v_4(k) + cs_1^{(1)}(k)$, and $v_9(k) = v_1(k) + v_5(k) + cs_2^{(2)}(k)$.

Figure 7:
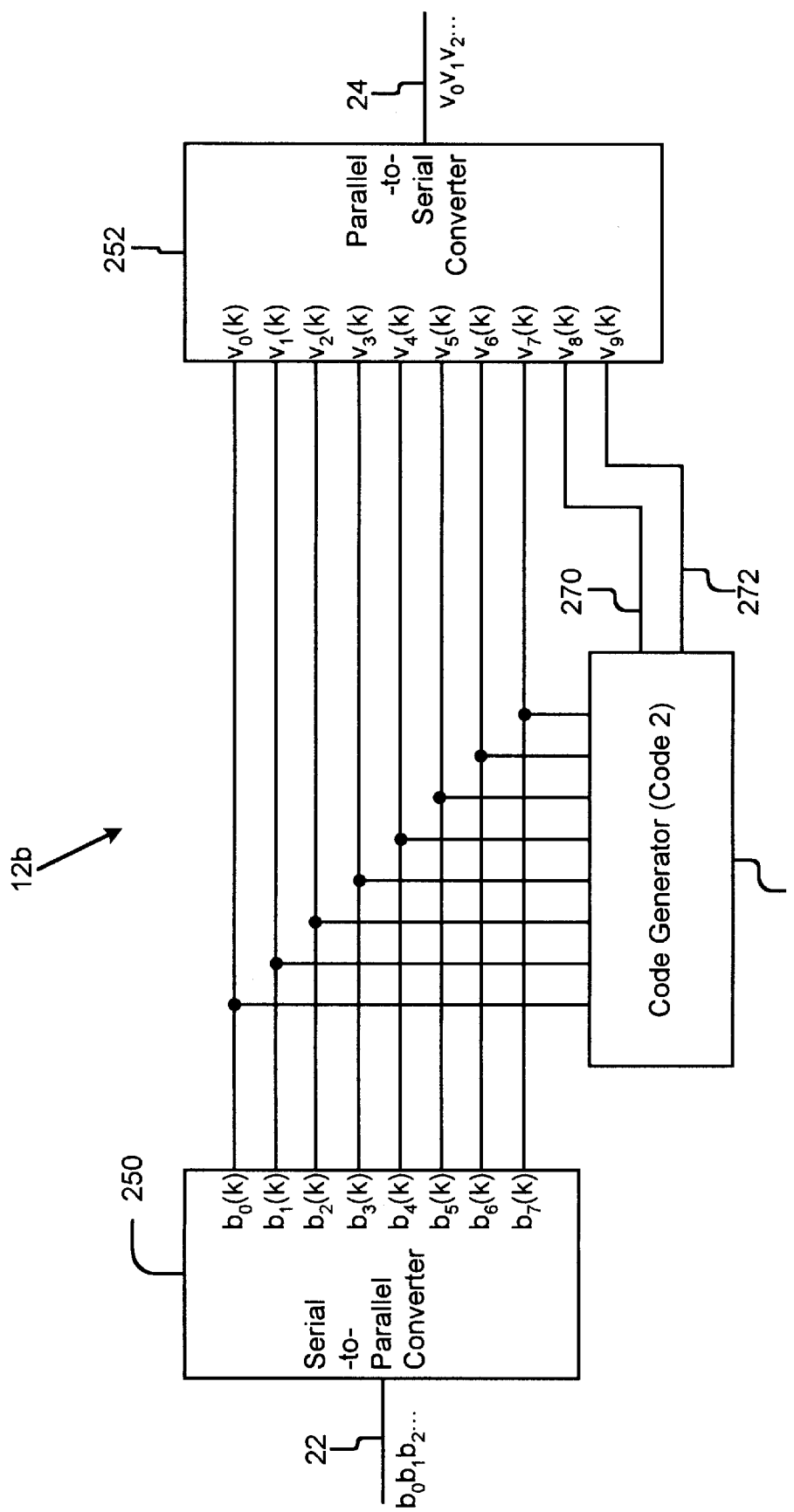
FIG. 7 is a second embodiment of the encoder constructed according to the present invention.

As shown in FIG. 7, the second embodiment of the encoder 12b includes a serial-to-parallel converter 250, a parallel-to-serial converter 252, and a code generator 254, similar to the first embodiment. However, in contrast to the first embodiment 12a, the second embodiment of the encoder 12b has a code generator 254 that adds two bits to the output stream. The serial-to-parallel converter 250 has an input and plurality of outputs, and is preferably a one-to-eight converter. The serial-to-parallel converter 250 receives a serial string having a predetermined number of bits, and provides those bits in parallel at its outputs. The input of the serial-to-parallel converter 250 is coupled to line 22 to receive the binary string $b_0, b_1, b_2, \ldots$ The serial-to-parallel converter 250 is preferably an 1-to-8 converter. Each of the outputs of the serial-to-parallel converter 250 is coupled to a respective input of the parallel-to-serial converter 252 to generate the bits $v_0$ through $v_7$ according to the above equations. The parallel-to-serial converter 252 preferably has a plurality of inputs (ten) and an output. The parallel-to-serial converter 252 receives a predetermined number of bits in parallel and converts them into a serial string of bits, $v_0, v_1, v_2, \ldots$. The output of the parallel-to-serial converter 252 is coupled to line 24 to provide the encoded sequence. The two additional inputs of the parallel-to-serial converter 252, $v_8$ and $v_9$ are coupled to line 270 and line 272, respectively, to receive two additional bits from the code generator 254. The code generator 254 preferably has a plurality of inputs which are coupled to receive $b_0(k)$ through $b_7(k)$ from the parallel-to-serial converter 252. The code generator 254 produces two additional bits, $b_8(k)$ and $b_9(k)$ according to the equations immediately above. These additional bits are sent to the parallel-to-serial converter 252 and are used as bit $v_8(k)$ and $v_9(k)$, respectively. The code generator 254 in the present invention has several embodiment 254a, and 254b, which will be described in more detail below with reference to FIGS. 9 and 10.

Figure 8:
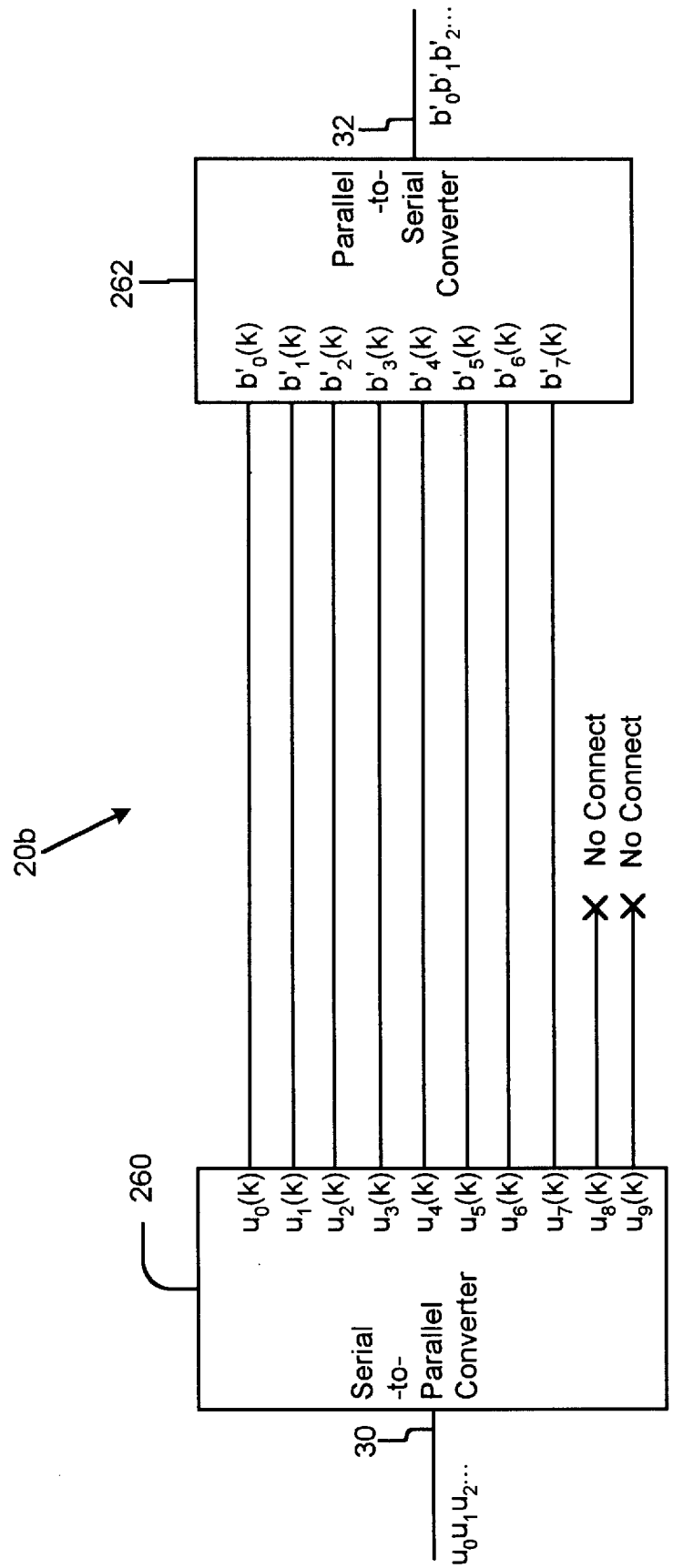
FIG. 8 is a block diagram of a second embodiment of the decoder of the present invention for use in conjunction with the encoder of FIG. 7.

Referring now to FIG. 8, a second embodiment of the decoder 20b for decoding signals encoded with code 2, is shown. The decoder 20b preferably comprises a serial-to-parallel converter 260 and a parallel-to-serial converter 262. The serial-to-parallel converter 260 preferably has an input and ten outputs, and converts an input string into ten parallel bits. The input of the serial-to-parallel converter 260 is coupled to line 30 to receive the sequence output by the detector 18. The parallel-to-serial converter 262 preferably has eight inputs and an output, and converts the eight input parallel bits into a string. The output of the parallel-to-serial converter 262 is coupled to line 32 to provide the reconstructed input string. Eight of the ten outputs, $u_0(k)$ through $u_7(k)$ of the serial-to-parallel converter 260 are coupled to respective inputs of the parallel-to-serial converter 262. The ninth and tenth outputs, $u_8(k)$ and $u_9(k)$ are not coupled to any input of the parallel-to-serial converter 262, thereby effectively dropping these bits from the sequence and decoding the bit stream from ten bits to eight bits to recreate the original format for the string.

Figure 9:
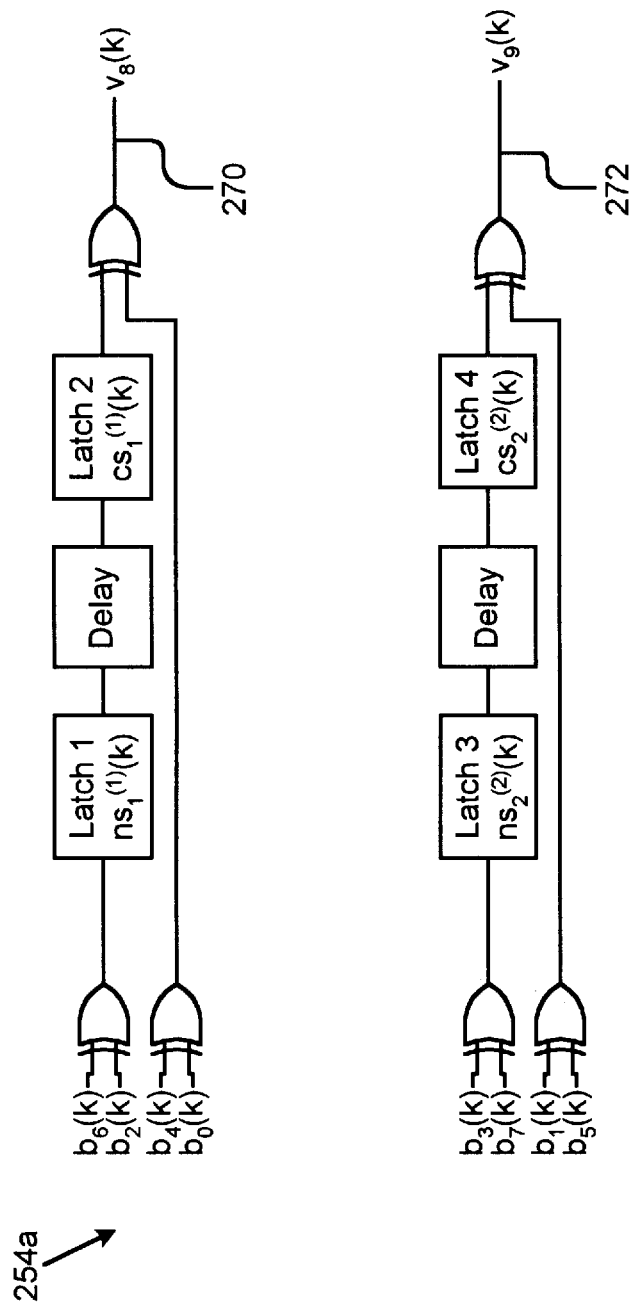
FIG. 9 is a block diagram of a first embodiment of a code generator used in the second embodiment of the encoder and constructed according to the present invention to generate a second code.

Referring now to FIG. 9, a first embodiment for the code 2 code generator 254a is shown. The first embodiment for the code 2 code generator 254a is a hardware implementation of equations $v_8(k)=v_0(k)+v_4(k)+cs_1^{(1)}(k)$, and $v_9(k)=v_1(k)+v_5(k)+cs_2^{(2)}(k)$. $b_6(k)$ and $b_2(k)$ are Exclusive-ORed together and the result is input into a first latch storing a next state. The output of the latch is delayed and then applied to the input to a second latch storing a current state. The output of the second latch is Exclusive-ORed with $b_4(k)$ and $b_0(k)$ to produce the first additional encoding bit that is output on line 270. The initial state of latch 2 is $cs_1^{(1)}(0)=x_{-2}$. Similarly, the hardware for producing the second additional bit, $v_9(k)$, has an identical structure, but receives $b_3(k)$, $b_7(k)$, $b_1(k)$, and $b_5(k)$ as inputs. The initial state of latch 4 is preferably $cs_2^{(2)}(0)=x_{-1}$.

Figure 10:
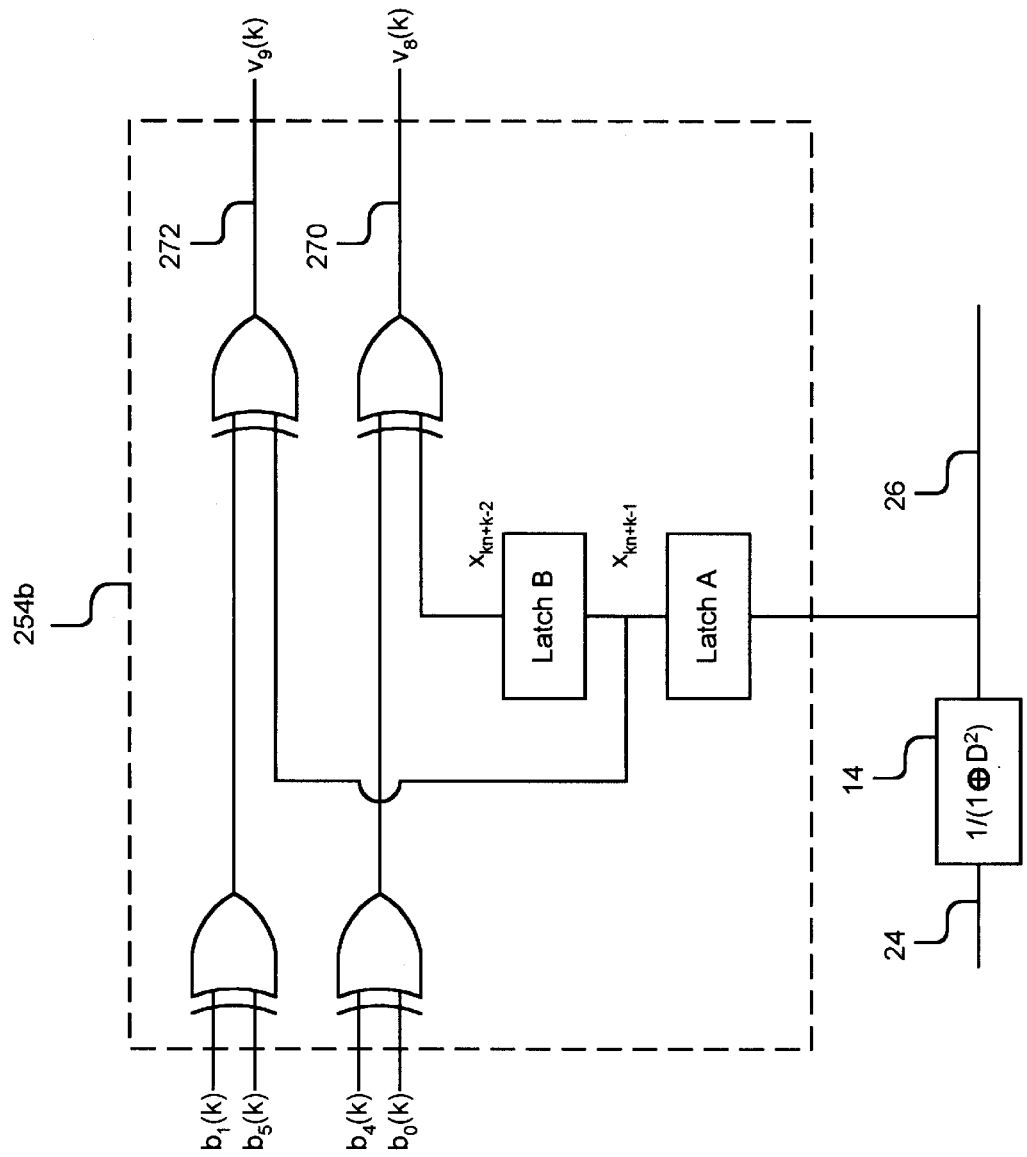
FIG. 10 is block diagram of a second embodiment of the code generator used in the second embodiment of the encoder of the present invention to generate a second code.

Referring now to FIG. 10, a second embodiment of the code 2 code generator 254b is shown. Based on corollary 2.4, (EQ 8) can be written as $T_1^{(1)}(k)+h^{(e)(1)}x_{kn+k-2}+h^{(o)(1)}x_{kn+k-1}=0$. Therefore, using (EQ 6), $v_8(k)$ can be written as $$v_8(k)=v_0(k)+v_4(k)+(h^{(e)(1)}x_{kn+-2}+h^{(o)(1)}x_{kn+k-1}). \tag{EQ 14}$$

However, $h_{(e)(1)}=1$ and $h^{(o)(1)}=0$, thus (EQ 14) simplifies to $$v_8(k)=v_0(k)+v_4(k)+x_{kn+k-2} \tag{EQ 15}$$

Similarly, (EQ 12) can be written as $T_1^{(2)}(k)+h^{(e)(2)}x_{kn+k-2}+h^{(o)(2)}x_{kn+k-1}=0$. Therefore, using (EQ10), $v_9(k)$ can be written as $$v_9(k)=v_1(k)+v_5(k)+(h^{(e)(2)}x_{kn+k-2}+h^{(o)(2)}x_{kn+k-1}). \tag{EQ 16}$$

However, $h^{(e)(2)}=0$ and $h^{(o)(2)}=1$, thus (EQ16) simplifies to $$v_9(k)=v_1(k)+v_5(k)+x_{k+k-1}. \tag{EQ 17}$$

The second embodiment of the code 2 encoder 254b is based on (EQ15) and (EQ17), and implements these equations with hardware. For example, as shown in FIG. 10, $b_1(k)$, $b_5(k)$, and the output of the precoder 14 via latch A ($x_{kn+k-1}$) are exclusive-ORed together and output as $v_9(k)$. Likewise, the output of the precoder 14 via latch B ($x_{kn+k-2}$) and $b_4(k)$ and $b_0(k)$, are exclusive-ORed and provide on line 270 as $v_8(k)$.

Figure 11:
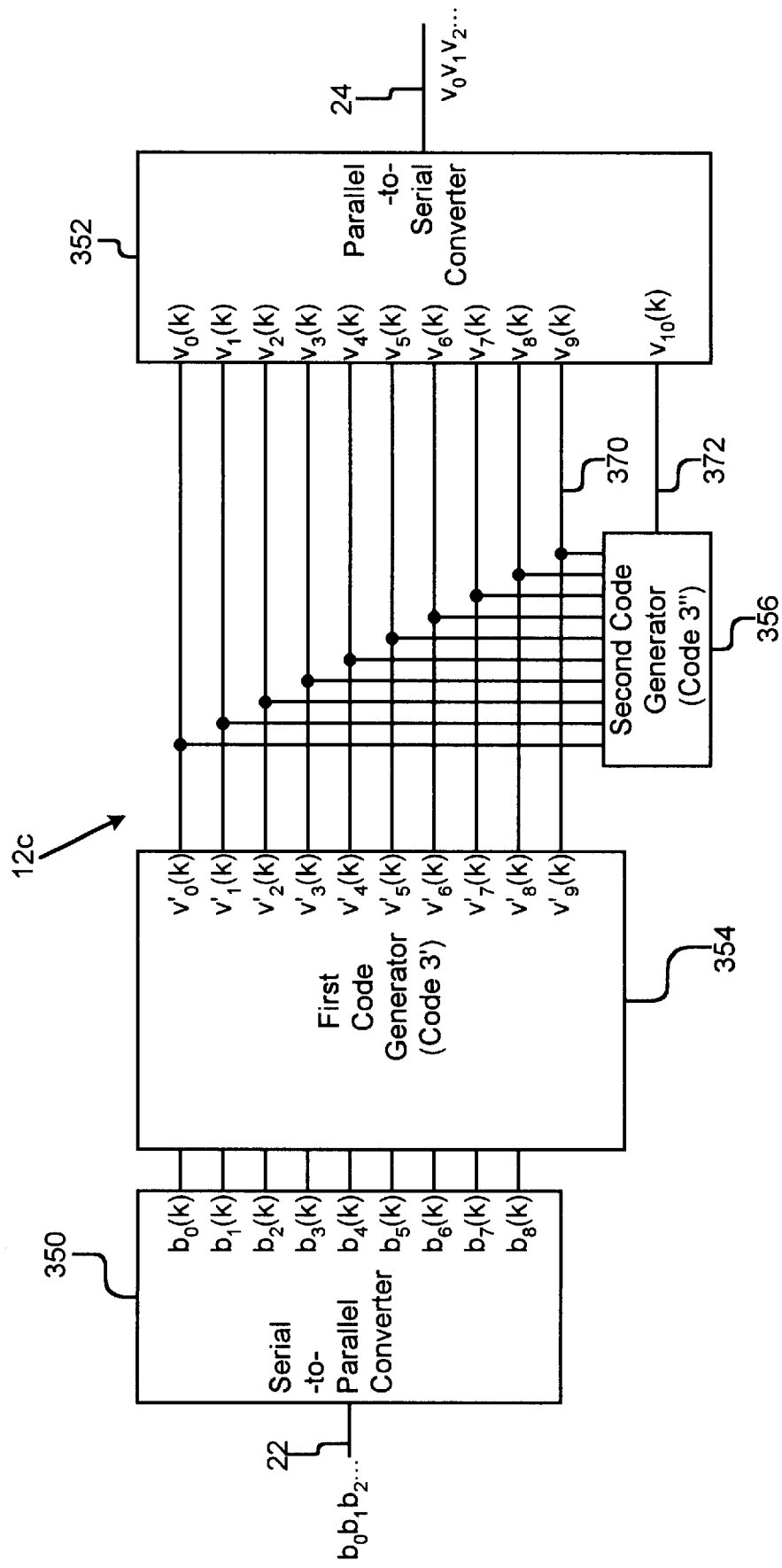
FIG. 11 is a third embodiment of the encoder constructed according to the present invention and having cascaded code generators.

Referring now to FIG. 11, a third embodiment for the encoder 12c of the present invention is shown. The third embodiment for the encoder 12c provides a code with a rate 9/11, and is a cascade of two codes, code 3' and code 3". With the present invention, Code 3' is any given rate 9/10 code. Code 3" inserts a bit into each codeword received from code 3' such that the resulting codeword satisfies one parity equation after precoding by $1/(1 \oplus D)$; the parity equation is on all codeword bits after preceding. Specifically, the code 3 encoder 12c takes 9 bits, $b_{9k}, b_{9k+1}, \ldots, b_{9k+8}$, every time $k \geq 0$ and produces 11 bits, $v_{11k}, v_{11k+1}, \ldots v_{11k+10}$. More specifically, code 3' takes $b_{9k}, b_{9k+1}, \ldots, b_{9k+8}$, and produces a 10 bit vector, $V'_{10k}, v'_{10k+1}, \ldots, v'_{10k+9}$, and code 3" takes the 10 bit vector and generates 11 bits, $v_{11k}, v_{11k+1}, \ldots, v_{11k+10}$, The notation $v_i(k), i \in \{0,1,\ldots,10\}$ is used for $V_{11k+i}$, and the notation $v'_i(k), i \in \{0,1, \ldots, 9\}$, for $v'_{10k+i}$, and $b_i(k), i \in \{0,1, \ldots, 8\}$, is used for $b_{9k+i}$. For this third code, it is desirable that:

$$\sum_{m=0}^{10} x_{11k+m} = 0,$$

for every $k \geq 0$, where $x_i$ is the output of a $1/(1 \oplus D)$ precoder corresponding to input $v_i$. Lemma 1 and Corollary 1.1 are used for n=10 to compute $a_q$, for $q \in \{0,1, \ldots, 10\}$ the following values:

$$\begin{bmatrix} q & = & 0\ 1\ 2\ 3\ 4\ 5\ 6\ 7\ 8\ 9\ 10 \\ a_q & = & 1\ 0\ 1\ 0\ 1\ 0\ 1\ 0\ 1\ 0\ 1 \end{bmatrix}$$

Therefore, the control integers are 0, 2, 4, 6, 8 and 10, and $T_1(k)$ is $$T_1(k)=v_0(k)+v_2(k)+v_4(k)+v_6(k)+v_8(k). \tag{EQ 18}$$

Using Corollary 1.2, with n=10 and r=11, code 3" is characterized as:

cs(k)=Current state at time $k \geq 0$, cs(0)=Current state at time $0=x_{-1}$, ns(k)=Next state at time, $k \geq 0$ $$ns(k) = cs(k) + \sum_{q=0}^{10} v_{11k+q} = cs(k) + r \sum_{q=0}^{10} v_q(k) \tag{EQ 19}$$

$\underline{v}$ = Output = $(v_{11k}, v_{11k+1}, \ldots, v_{11k+10})$.

The present invention uses bit 10 as a control integer to force the equation $$T_1(k)+cs(k)=0, \tag{EQ 20}$$

for all $k \geq 0$. Therefore, the output, v, of the code 3" is described by the following equations.

$$v_0(k)=v'_0(k),$$

$v_1(k)=v'_1(k),$ $v_2(k)=v'_2(k),$ $v_3(k)=v'_3(k),$ $v_4(k)=v'_4(k),$ $v_5(k)=v'_5(k),$ $v_6(k)=v'_6(k),$ $v_7(k)=v'_7(k),$ $v_8(k)=v'_8(k),$ $v_9(k)=v'_9(k),$ $v_{10}(k)=cs(k)+v_0(k)+v_2(k)+v_4(k)+v_6(k)+v_8(k).$

As shown in FIG. 11, the third embodiment of the encoder 12c includes a serial-to-parallel converter 350, a parallel-to-serial converter 352, a first code generator 354, and a second code generator 356. Unlike the first two embodiment, the third embodiment utilizes a plurality of cascaded code generators. The serial-to-parallel converter 350 has an input and plurality of outputs, and is preferably a one-to-eight converter. The serial-to-parallel converter 350 receives a serial string having a predetermined number of bits, and provides those bits in parallel at its outputs. The input of the serial-to-parallel converter 350 is coupled to line 22 to receive the binary string $b_0, b_1, b_2, \ldots$ Each of the outputs of the serial-to-parallel converter 350 is coupled to a respective input of the first code generator 354. The first code generator 354 preferably provides a plurality of input and a plurality of outputs. For example, the first code generator 354 has eight inputs and nine outputs. As has been noted above, the first code generator 354 may be any one of a number of 8/9 rate code generators. The first code generator 354 uses the input string to generate a code 3' sequence. The nine parallel outputs of the first code generator 354 are preferably coupled to the first nine respective inputs of the parallel-to-serial converter 352 to generate the bits $v_0$ through $v_9$ according to the above equations. In this embodiment, the parallel-to-serial converter 352 preferably has a plurality of inputs (eleven) and an output. The parallel-to-serial converter 352 receives a predetermined number of bits in parallel and converts them into a serial string of bits, $v_0, v_1, v_2, \ldots$ The output of the parallel-to-serial converter 352 is coupled to line 24 to provide the encoded sequence. One input of the parallel-to-serial converter 352, $v_{10}$ is coupled to line 372 to receive an additional bit from the second code generator 356. The second code generator 356 preferably has a plurality of inputs which are coupled to receive $v'_0(k)$ through $v'_9(k)$ from the first code generator 354. The second code generator 356 produces an additional bits, $v_{10}(k)$ according to the equations immediately above. This additional bit is sent to the parallel-to-serial converter 352 and is used as bit $v_{10}(k)$. The second code generator 356 in the present invention has several embodiment 356a, and 356b, which will be described in more detail below with reference to FIGS. 13 and 14.

Figure 12:
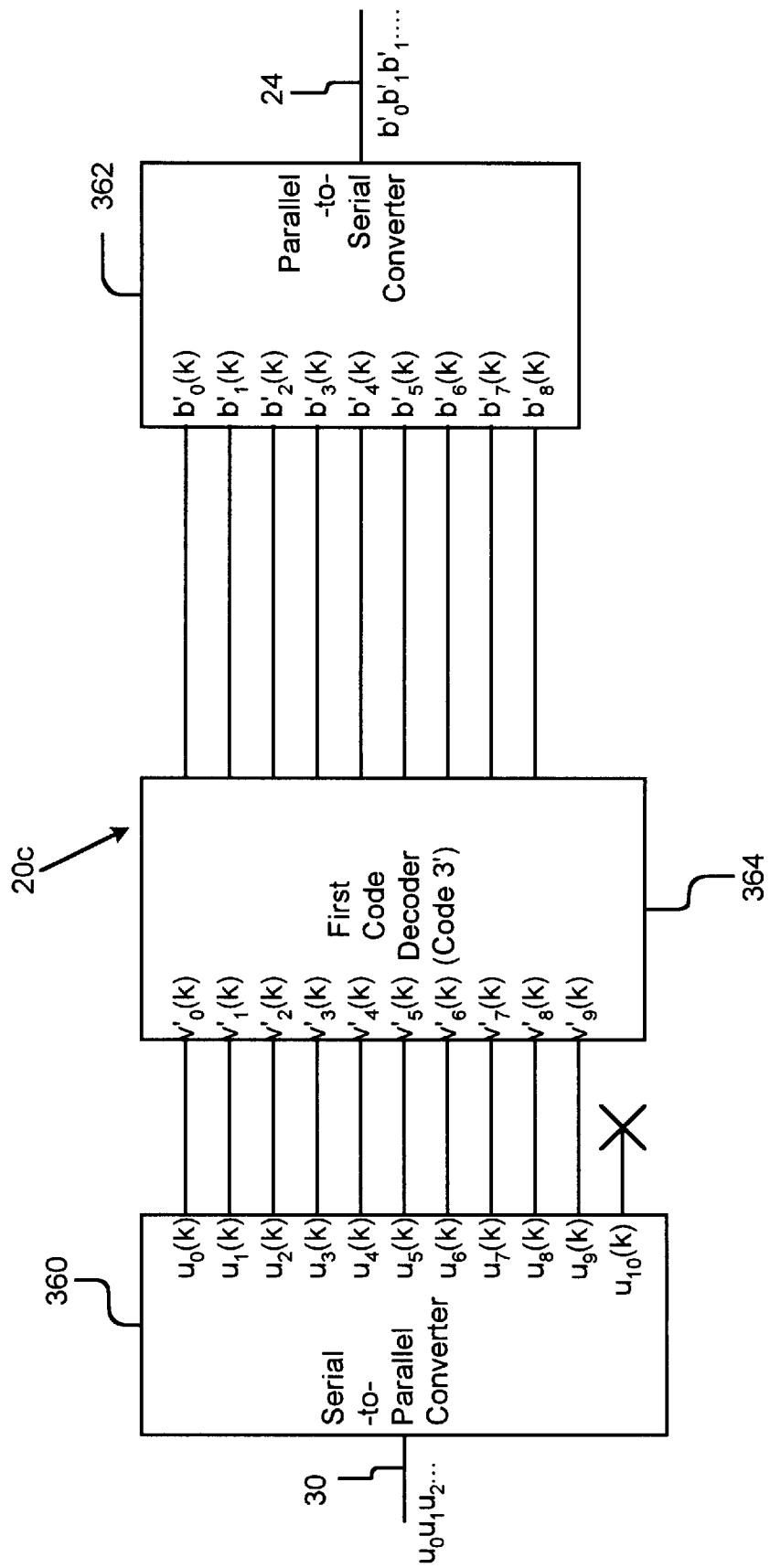
FIG. 12 is a block diagram of a third embodiment of the decoder of the present invention for use in conjunction with the encoder of FIG. 11.

Referring now to FIG. 12, a third embodiment of the decoder 20c for decoding signals encoded with code 3, is shown. The decoder 20c preferably comprises a serial-to-parallel converter 360, a parallel-to-serial converter 362 and a code 3' decoder 364. The serial-to-parallel converter 360 preferably has an input and eleven outputs, and converts an input string into eleven parallel bits. The input of the serial-to-parallel converter 360 is coupled to line 30 to receive the sequence output by the detector 18. The code 3' decoder 364 preferably has a plurality (ten) of input and a plurality (nine) of outputs. The inputs of the code 3' decoder 364 are coupled to receive ten of the eleven outputs, $u_0(k)$ through $u_9(k)$, of the serial-to-parallel converter 360. Of the nine outputs of the code 3' decoder 364 are likewise coupled to respective inputs of the parallel-to-serial converter 362. The parallel-to-serial converter 362 preferably has nine inputs and an output, and converts the nine input parallel bits into a string. The output of the parallel-to-serial converter 362 is coupled to line 32 to provide the reconstructed input string.

Figure 13:
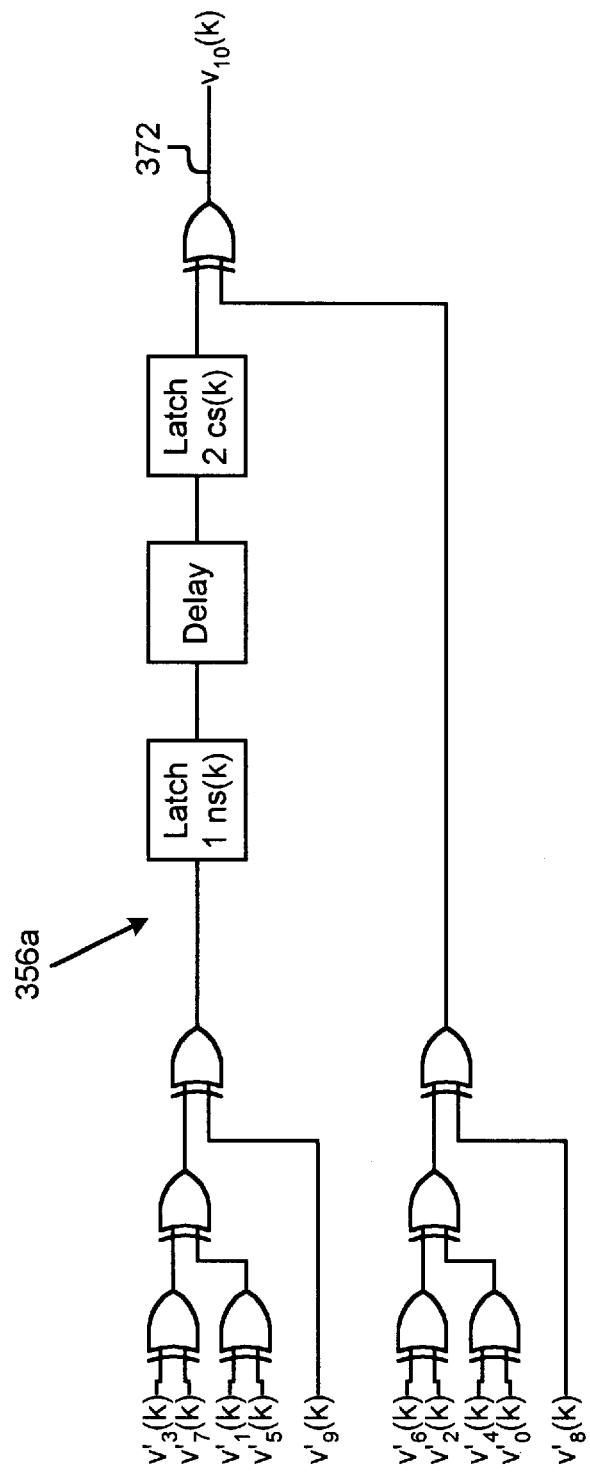
FIG. 13 is a block diagram of a first embodiment of a code generator used in the third embodiment of the encoder and constructed according to the present invention to generate a third code.

Referring now to FIG. 13, a first embodiment for the code 3" code generator 356a is shown. The first embodiment for the code 3" code generator 356a is a hardware implementation of the equation $v_{10}(k)=cs(k)+v_0(k)+v_2(k)+v_4(k)+v_6(k)+v_8(k)$. As shown in FIG. 13, a first group of outputs, $v'_1(k), v'_3(k), v'_5(k), v'_7(k)$, and $v'_9(k)$ from the code 3' encoder 354 are exclusive-ORed and applied to the input of the first latch to produce through delay and a second latch the cs(k) signal. The initial state of latch 2 is Cs $(0)=x_{-1}$. This signal is in turn exclusive-ORed with a second group of outputs, $v'_0(k), v'_2(k), v'_4(k), v'_6(k)$, and $v'_8(k)$ to produce the $v_{10}(k)$ signal on line 372.

Figure 14:
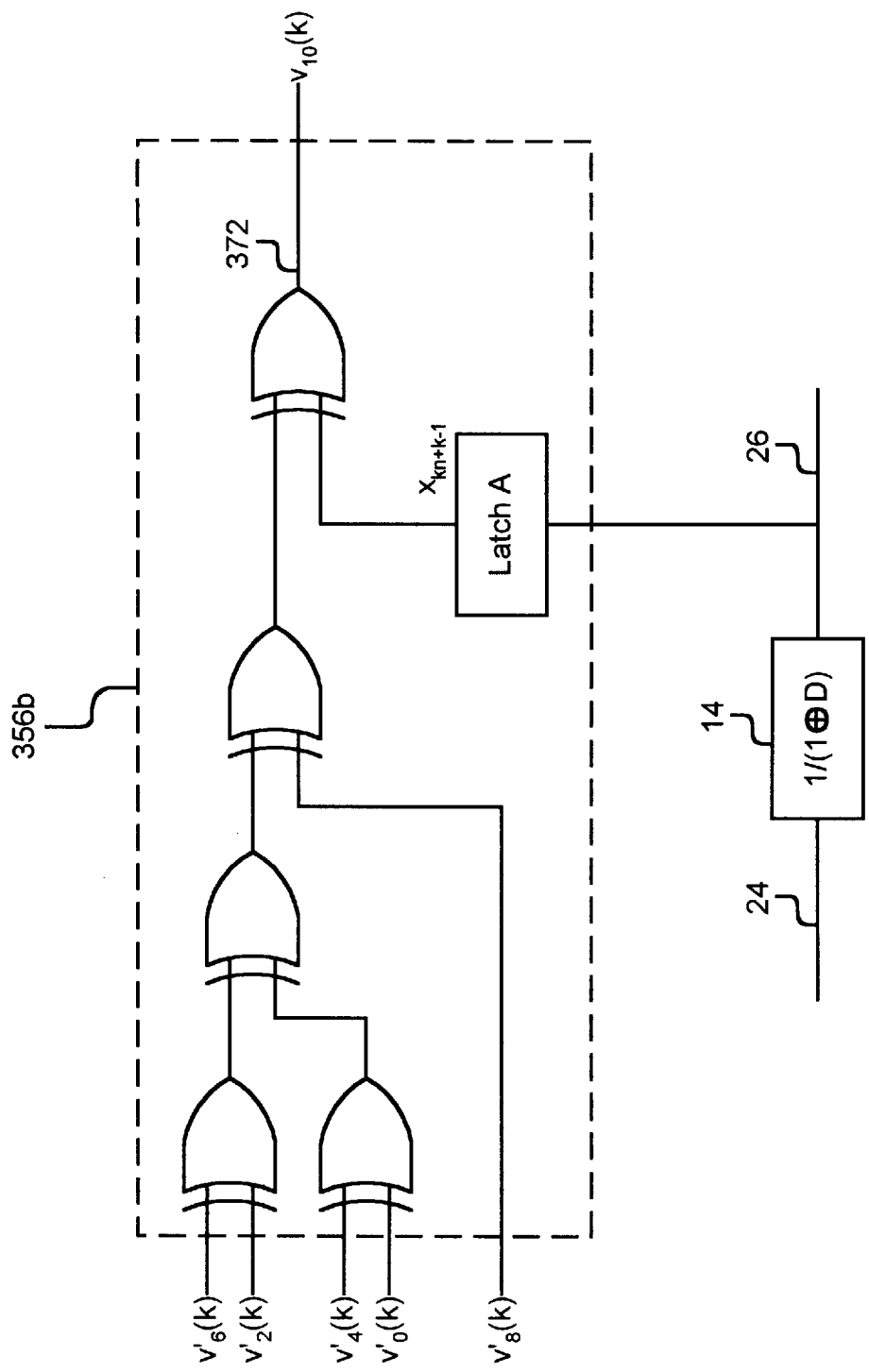
FIG. 14 is block diagram of a second embodiment of the code generator used in the third embodiment of the encoder of the present invention to generate a third code.

A second embodiment of code 3" encoder 356b is shown in FIG. 14. Based on Corollary 1.4, EQ20 can be written as $T_1(k)+x_{kn+k-1}=0$. Therefore, using (EQ18), $v_{10}(k)$ can be written as $v_{10}(k)=v_0(k)+v_2(k)+v_4(k)+V_8(k)+x_{kn+k-1}$. The second embodiment of code 3" encoder 356b is based on and implements the above equation in hardware.

While the present invention has been described above with reference to specific preferred embodiments, the description is illustrative of the invention and is not to be construed as limiting the invention. For example, one specific modification is that the desired parity after precoding requires a mod n for some n>2 arithmetic, since mod 2 arithmetic has be considered in detail above. Various other modifications to the present invention can be made to the preferred embodiments by those skilled in the art without departing from the true spirit and scope of the invention as defined by the appended claims.

APPENDIX A

Necessary & Sufficient Conditions To Produce A Code With A Pre-Selected Parity Structure After Precoding The following lemma gives a necessary and sufficient conditions on the coded sequence $v_0 v_1 v_2 \ldots$ such that consecutive blocks of length n+1 of $1/(1 \oplus D)$ precoder output sequence, $x_0 x_1 x_2 \ldots$, satisfy a given parity equation, for some integer n>0.

LEMMA 1: Let a binary sequence $x_0 x_1 x_2 \ldots$ be the output of a $1/(1 \oplus D)$ precoder corresponding to a binary input sequence $v_0 v_1 v_2 \ldots$ ; let $x_1$ be the initial value of the precoder; let $\{i_1, i_2, \ldots, i_r\}$ be a non-empty subset of $J=\{0, 1, 2, \ldots, n\}$, for some integer n.

Then $$\sum_{t=1}^{r} x_{kn+k+i_t} = 0, \qquad (EQ\ 1)$$

for every integer $k \geq 0$ if and only if $$T_1(k)+rT_2(k)=0, \qquad (EQ\ 2)$$

for every integer $k \geq 0$, where $$T_1(k) = \sum_{q=0}^{n} a_q v_{kn+k+q}, \quad (EQ\ 3)$$

$$T_2(k) = \sum_{q=-1}^{kn+k-1} v_q, \quad (EQ\ 4)$$

and where $v_{-1} = x_{-1}$, and for $q \in \{0, 1, \ldots, n\}$, $$a_q = \begin{cases} 1 & \text{if number of } i_t \geq q \text{ is odd,} \\ 0 & \text{otherwise.} \end{cases}$$

(Note, arithmetic is mod 2 except stated otherwise.)
PROOF:
The output of $1/(1 \oplus D)$ precoder relates to its input according to EQ5 below.

$$x_k = v_k + x_{k-1} \quad (EQ\ 5)$$

Therefore, for every integer $m \geq 0$, $$x_k = \sum_{i=m}^{k} v_i + x_{m-1} \quad (EQ\ 6)$$

Now using EQ6, we can write EQ1 as $$\sum_{t=1}^{r} \left( \sum_{q=0}^{kn+k+i_t} v_q + x_{-1} \right) = 0. \quad (EQ\ 7)$$

We break the second sum into two sums as follows.

$$\sum_{t=1}^{r} \left( \sum_{q=0}^{kn+k-1} v_q + \sum_{q=kn+k}^{kn+k+i_t} v_q + x_{-1} \right) = 0 \quad (EQ\ 8)$$

Therefore, for every integer $k \geq 0$, EQ1 is equivalent to $$r \sum_{q=0}^{kn+k-1} v_q + \sum_{t=1}^{r} \sum_{q=kn+k}^{kn+k+i_t} v_q + rx_{-1} = 0. \quad (EQ\ 9)$$

The double summation in the above equation is the same as $T_1(k)$, hence, EQ2 follows from EQ9. Q.E.D.

We call EQ2 the pre-precoder-parity ($p^3$) equation for $1/(1 \oplus D)$, and we refer to an integer $q$ in $q = \{0, 1, \ldots, n\}$ as a control integer if $a_q = 1$.

The following corollaries are direct consequences of Lemma 1.

COROLLARY 1.1: Let $\{i_1, i_2, \ldots, i_r\} = \{0, 1, 2, \ldots, n\} = J$, for a positive integer $n$, then for $q \in \{0, 1, \ldots, n\}$, we have
$a_q = 1$ if $(q+n)$ is even,
$a_q = 0$ if $(q+n)$ odd.

COROLLARY 1.2: EQ1 can be forced at the output of a $1/(1 \oplus D)$ precoder by a finite state machine having at time $k$:

$$cs(0) = \text{Current state at time } 0 = rx_{-1}, \quad (EQ\ 10)$$

$cs(k) = $ Current state at time $k > 0 = ns(k-1)$, $ns(k) = $ Next state at time $(k \geq 0) = r \sum_{q=0}^{n} v_{kn+k+q} + cs(k)$, and $\underline{v} = $ Output $= (v_{kn+k}, v_{kn+k+1}, \ldots, v_{kn+k+n})$, where one bit $v_{kn+k+q}$ in the output, $q$ such that $a_q = 1$, is adjusted to force ($p^3$) equation for $1/(1 \oplus D)$, i.e., at time $k=0$, the equation $T_1(k) + rx_{-1} = 0$, and at time $k \geq 1$, the equation $T_1(k) + rT_2(k) = 0$. Equivalently, one bit $v_{kn+k+q}$ in the output, $q$ such that $a_q = 1$, is adjusted to satisfy the equation $T_1(k) + rcs(k) = 0$, for all $k \geq 0$. Note that $q$ is a control integer here.

Note that $cs(k)$ and $ns(k)$ become $rT_2(k)$ and $rT_2(k+1)$, respectively.

COROLLARY 1.3: If $r$ is even, then $cs(k) = ns(k) = 0$ for all $k \geq 0$.

Therefore, no state information need to be kept, and the finite state machine reduces to a block encoder.

COROLLARY 1.4: $T_2(k) = x_{kn+k-1}$.

This follows from EQ6. Among consequences of this corollary are: (1) the ($p^3$) equation for $1/(1 \oplus D)$ can be written as $T_1(k) + rx_{kn+k-1} = 0$, (2) $cs(k)$ and $ns(k)$ become $rx_{kn+k-1}$ and $rx_{(k+1)n+k}$, respectively. Therefore, the output of the precoder at time $kn+k-1$ can act as current state at time $k$ for the finite state machine of corollary 1.2.

Advantage of using the output of the precoder for computing current state, as described above, is that errors don't propagate.

COROLLARY 1.5: In Corollary 1.2, the next state, $ns(k)$, can be computed as $$ns(k) = \text{Next state at time } (k \geq 0) = r \sum_{q=0}^{n} v_{kn+k+q} + T_1(k).$$

This follows from the fact that $T_1(k) + cs(k) = 0$ (note arithmetic is mod 2).

The following lemma gives a necessary and sufficient conditions on the coded sequence $v_0 v_1 v_2 \ldots$ such that consecutive blocks of length $n+1$ of $1/(1 \oplus D^2)$ precoder output sequence, $x_0 x_1 x_2 \ldots$, satisfy a given parity equation, for some integer $n \geq 0$.

LEMMA 2: Let a binary sequence $x_0 x_1 x_2 \ldots$ be the output of a $1/(1 \oplus D^2)$ precoder corresponding to a binary input sequence $v_0 v_1 v_2 \ldots$; let $x_{-1}$ and $x_{-2}$ be the initial values of the precoder; let $\{i_1, i_2, \ldots, i_r\}$ be a set of distinct integers belonging to $J = \{0, 1, 2, \ldots, n\}$, for some integer $n$. Then $$\sum_{t=1}^{r} x_{kn+k+i_t} = 0, \quad (EQ\ 11)$$

for every integer $k \geq 0$ if and only if $$T_1(k) + T_2(k) = 0, \quad (EQ\ 12)$$

for every integer $k \geq 0$, where $$T_1(k) = \sum_{q=0}^{n} a_q v_{kn+k+q}, \quad (EQ\ 13)$$

$$T_2(k) = a^{(e)}(k) \sum_{q=-1}^{\lceil (kn+k)/2 \rceil - 1} v_{2q} + a^{(o)}(k) \sum_{q=-1}^{\lceil (kn+k)/2 \rceil - 1} v_{2q+1}, \quad (EQ\ 14)$$

and where $v_{-1} = x_{-1}$, and $v_{-2} = x_{-2}$, and for $q \in \{0, 1, \ldots, n\}$, $$a_q = \begin{cases} 1 & \begin{cases} \text{if } q \text{ is even and the number of even } i_t \text{ such} \\ \text{that } i_t \geq q \text{ is odd, or} \\ \text{if } q \text{ is odd and the number of odd } i_t \text{ such} \\ \text{that } i_t \geq q \text{ is odd,} \end{cases} \\ 0 & \text{otherwise.} \end{cases}$$

$$a^{(e)}(k) = \begin{cases} 1 & \text{if number of even } kn+k+i_t \text{ is odd, and} \\ 0 & \text{otherwise.} \end{cases}$$

$$a^{(o)}(k) = \begin{cases} 1 & \text{if number of even } kn+k+i_t \text{ is odd, and} \\ 0 & \text{otherwise.} \end{cases}$$

(Note, arithmetic is mod 2 except states otherwise.) $\lfloor x \rfloor$ and $\lceil x \rceil$ are the floor and ceiling functions of $x$, respectively.)
PROOF:

The output of $1/(1\oplus D^2)$ precoder relates to its input according to EQ15 below.

$$x_k = v_k + x_{k-2} \tag{EQ 15}$$

Therefore, for every integer $\lfloor k/2 \rfloor \geq l \geq 0$, $$x_k = \sum_{m=0}^{l} v_{k-2m} + x_{k-2l-2} \tag{EQ 16}$$

Now using EQ16, we can write EQ11 as $$\sum_{t=1}^{r} \left( \sum_{m=0}^{\lfloor (j+i_t)/2 \rfloor} v_{j+i_t-2m} + x_{j+i_t-2\lfloor (j+i_t)/2 \rfloor -2} \right) = 0, \tag{EQ 17}$$

where $j=kn+k$. We break the second sum into two sums as follows.

$$\sum_{t=1}^{r} \left( \sum_{m=0}^{\lfloor i_t/2 \rfloor} v_{j+i_t-2m} + \sum_{m=\lfloor i_t/2 \rfloor +1}^{\lfloor (j+i_t)/2 \rfloor} v_{j+i_t-2m} + x_{j+i_t-2\lfloor (j+i_t)/2 \rfloor -2} \right) = 0 \tag{EQ 18}$$

The above can be written as $$\sum_{t=1}^{r} \sum_{m=0}^{\lfloor i_t/2 \rfloor} v_{j+i_t-2m} + \sum_{t=1}^{r} \left( \sum_{m=\lfloor i_t/2 \rfloor +1}^{\lfloor (j+i_t)/2 \rfloor} v_{j+i_t-2m} + x_{j+i_t-2\lfloor (j+i_t)/2 \rfloor -2} \right) = 0. \tag{EQ 19}$$

The first double summation is the same as $T_1(k)$, and the second double sum can be broken into two double sums S (odd) and S (even) as follows.

$$S\text{ (odd)} = \sum_{t=1}^{r} \left( \sum_{m=\lfloor i_t/2 \rfloor +1}^{\lfloor (j+i_t)/2 \rfloor} v_{j+i_t-2m} + x_{j+i_t-2\lfloor (j+i_t)/2 \rfloor -2} \right)$$

$t$ such that $j + i_t$ is odd $$S\text{ (even)} = \sum_{t=1}^{r} \left( \sum_{m=\lfloor i_t/2 \rfloor +1}^{\lfloor (j+i_t)/2 \rfloor} v_{j+i_t-2m} + x_{j+i_t-2\lfloor (j+i_t)/2 \rfloor -2} \right)$$

$t$ such that $j + i_t$ is even

The sum, S (odd) can be written as $$S\text{ (odd)} = \sum_{t=1}^{r} \left( \sum_{m=\lfloor i_t/2 \rfloor +1}^{(j+i_t-1)/2} v_{j+i_t-2m} + x_{j+i_t-(j+i_t-1)-2} \right),$$

$t$ such that $j + i_t$ is odd and S (even) can be written as $$S\text{ (even)} = \sum_{t=1}^{r} \left( \sum_{m=\lfloor i_t/2 \rfloor +1}^{(j+i_t)/2} v_{j+i_t-2m} + x_{j+i_t-(j+i_t)-2} \right).$$

$t$ such that $j + i_t$ is even

Now, S (odd)+S (even)=$T_2(k)$. To see this, use a change of variable $q=(j+i_t-2m-1)/2$ in S (odd), and a change of variable $q=(j+i_t-2m)/2$ in S (even). Hence, EQ12 follow from EQ19. Q.E.D.

We call EQ12 the pre-precoder-parity ($p^3$) equation for $1/(1\oplus D^2)$, and we refer to an integer q in $\{0, 1, \ldots, n\}$ as a control integer if $a_q=1$.

The following corollaries are direct consequences of Lemma 2.

COROLLARY 2.1: Let $\{i_1, i_2, \ldots, i_r\} \subseteq \{0, 1, 2, \ldots, n\} = J$, for a positive integer n, then for $q \in \{0,1, \ldots, n\}$ and an even n, we have $a_q = 1$ if $(q+n)$ is 0 or 3 (mod4), $a_q = 0$ otherwise, $$a^{(e)}(k) = \begin{cases} 1 & \begin{cases} \text{if } k \text{ is even, and } n = 0 \bmod 4, \text{ or} \\ \text{if } k \text{ is odd, and } n = 2 \bmod 4, \\ \text{if } k \text{ is even, and } n = 2 \bmod 4, \text{ or} \end{cases} \\ 0 & \begin{cases} \text{if } k \text{ is odd, and } n = 0 \bmod 4, \end{cases} \end{cases}$$

$$a^{(o)}(k) = \begin{cases} 1 & \begin{cases} \text{if } k \text{ is even, and } n = 2 \bmod 4, \text{ or} \\ \text{if } k \text{ is odd, and } n = 0 \bmod 4, \\ \text{if } k \text{ is even, and } n = 0 \bmod 4, \text{ or} \end{cases} \\ 0 & \begin{cases} \text{if } k \text{ is odd, and } n = 2 \bmod 4, \end{cases} \end{cases}$$

and for odd n, we have $a_q = 1$ if $(q+n)$ is 1 or 2 (mod4), $a_q = 0$ otherwise, $$a^{(e)}(k) = a^{(o)}(k) = \begin{cases} 1 & \text{if } n = 1 \bmod 4, \\ 0 & \text{if } n = 3 \bmod 4. \end{cases}$$

Recall that arithmetic is mod 2 except stated otherwise.

COROLLARY 2.2: EQ11 can be forced at the output of a $1/(1\oplus D^2)$ precoder by a finite state machine having at time k:

$cs(0) = (cs_1(0), cs_2(0)) = (x_{-2}, x_{-1})$ $cs(k) = (ns_1(k-1), ns_2(k-1))$ for $k > 0$, $$ns(k) = (ns_1(k), ns_2(k)) = \left( cs_1(k) + \sum_{\substack{t \in S(k) \\ t \text{ even}}} v_t, cs_2(k) + \sum_{\substack{t \in S(k) \\ t \text{ odd}}} v_t \right)$$

for $(k \geq 0,)$ $\underline{v}$ = Output = $(v_{kn+k}, v_{kn+k+1}, \ldots, v_{kn+k+n})$, where $S(k) = \{kn+k, kn+k+1, \ldots, kn+k+n\}$, and one bit $v_{kn+k+q}$ in the output, q such that $a_q=1$, is adjusted to force ($p^3$) equation for $1/(1\oplus D^2)$, i.e., at time k=0, the equation $T_1(k)+a^{(e)}(0)x_{-2}+a^{(o)}(0)x_{-1}=0$, and at time $k \geq 1$, the equation $T_1(k)+T_2(k)=0$. Equivalently, one bit $v_{kn+k+q}$ in the output, q such that $a_q=1$, is adjusted to satisfy the equation $T_1(k)+a^{(e)}(k)cs_1(k)+a^{(o)}(k)cs_2(k)=0$, for all $k \geq 0$. Note that q is a control integer here. Note that $a^{(e)}(k)cs_1(k)+a^{(o)}(k)cs_2(k)$ and $a^{(e)}(k)ns_1(k)+a^{(o)}(k)ns_2(k)$ become $T_2(k)$ and $T_2(k+1)$, respectively.

COROLLARY 2.3: If $a^{(e)}(k)$ and $a^{(o)}(k)$ are even for all $k \geq 0$, then $cs(k)=ns(k)=(0, 0)$ for all $k \geq 0$.

Therefore, no state information need to be kept, and the finite state machine reduces to a block encoder. This condition arises when n+1 is even and number of even $i_t$ is even and number of odd $i_t$ is even.

COROLLARY 2.4: $T_2(k) = h^{(e)}x_{kn+k-1} + h^{(o)}x_{kn+k-2}$, where $$h^{(e)} = \begin{cases} 1 & \text{if number of even } i_t \text{ is odd, and} \\ 0 & \text{otherwise,} \end{cases}$$

$$h^{(o)} = \begin{cases} 1 & \text{if number of odd } i_t \text{ is odd, and} \\ 0 & \text{otherwise.} \end{cases}$$

To see this, let $i^{(e)}(k)$ denotes the largest even integer less than $kn+k$, and let $i^{(o)}(k)$ denote the largest odd integer less than $kn+k$, then using EQ16, $T_2(k)$ of EQ14 can be written as $$T_2(k) = a^{(e)}(k) x_{i^{(e)}(k)} + a^{(o)}(k) x_{i^{(o)}(k)}. \tag{EQ 20}$$

However, the right side of EQ20 equals $h^{(e)} x_{kn+k-2} + h^{(o)} x_{kn+k-1}$.

Among consequences of this corollary are that the ($p^3$) equation for $1/(1 \oplus D^2)$ can be written as $$T_1(k) + h^{(e)} x_{kn+k-2} + h^{(o)} x_{kn+k+1} = 0,$$

further $cs(k)$ become $$cs(k) = \begin{cases} (x_{kn+k-1}, x_{kn+k-2}) & \text{if } (kn+k-1) \text{ is even, and} \\ (x_{kn+k-2}, x_{kn+k-1}) & \text{otherwise.} \end{cases}$$

Therefore, the output of the precoder at times $kn+k-1$ and $kn+k-2$ can provide the current state at time $k$ for the finite state machine of corollary 2.2. Again, advantage of using the output of the precoder for computing current state as described above is that errors don't propagate.

COROLLARY 2.5: If $n$ is odd, then $$a^{(e)}(k) = [r_1]_2 \text{ for all } k, \text{ and}$$

$$a^{(o)}(k) = [r_2]_2 \text{ for all } k.$$

On the other hand, if $n$ is even, then $$a^{(e)}(k) = \begin{cases} [r_1]_2 & \text{if } k \text{ is even,} \\ [r_2]_2 & \text{if } k \text{ is odd,} \end{cases}$$

$$a^{(o)}(k) = \begin{cases} [r_1]_2 & \text{if } k \text{ is odd,} \\ [r_2]_2 & \text{if } k \text{ is even,} \end{cases}$$

where $[x]_2$ denotes the remainder of division $x \div 2$.

COROLLARY 2.6: If $n$ is odd, then EQ11 can be forced at the output of a $1/(1 \oplus D^2)$ precoder by a finite state machine having at time $k$:

$$cs(0) = [r_1 x_{-2} + r_2 x_{-1}]_2,$$

$$cs(k) = ns(k-1) \text{ for } k > 0,$$

$$ns(k) = cs(k) + r_1 \sum_{\substack{t \in S(k) \\ t \text{ even}}} v_t + r_2 \sum_{\substack{t \in S(k) \\ t \text{ odd}}} v_t \text{ for } k \geq 0,$$

$$\underline{v} = \text{Output} = (v_{kn+k}, v_{kn+k+1}, \ldots, v_{kn+k+n}),$$

where $S(k) = \{kn+k, kn+k+1, \ldots, kn+k+n\}$, and one bit $v_{kn+k+q}$ in the output, $q$ such that $a_q=1$, is adjusted to force ($p^3$) equation for $1/(1 \oplus D^2)$. More specifically, one bit $v_{kn+k+q}$ in the output, $q$ such that $a_q=1$, is adjusted such that $T_1(k) + cs(k) = 0$.

This corollary follows from Lemma 2 and Corollary 2.5. We note that the next state $ns(k)$ can be computed alternatively by $$ns(k) = T_1(k) + r_1 \sum_{\substack{t \in S(k) \\ t \text{ even}}} v_t + r_2 \sum_{\substack{t \in S(k) \\ t \text{ odd}}} v_t$$

since $T_1(k) + cs(k) = 0$.

The following two corollaries are similar to Corollary 2.6, however, they are for the case of even $n$.

COROLLARY 2.7: If $n$ is even, then EQ11 can be forced at the output of a $1/(1 \oplus D^2)$ precoder by a finite state machine having at time $k$:

$$cs(0) = (cs_1(0), cs_2(0)) = ([r_1 x_{-1} + r_2 x_{-2}]_2, [r_1 x_{-2} + r_2 x_{-1}]_2),$$

$$cs(k) = (ns_1(k-1), ns_2(k-1)) \text{ for } k > 0,$$

$$ns(k) = (ns_1(k), ns_2(k)) \text{ for } k \geq 0,$$

$$ns_1(k) = cs_2(k) + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t},$$

$$ns_2(k) = cs_1(k) + r_1 \sum_{\substack{t \in \{0,\ldots,n\} \\ t \text{ odd}}} v_{kn+k+t} + r_2 \sum_{\substack{t \in \{0,\ldots,n\} \\ t \text{ even}}} v_{kn+k+t},$$

$$\underline{v} = \text{Output} = (v_{kn+k}, v_{kn+k+1}, \ldots, v_{kn+k+n}),$$

where one bit $v_{kn+k+q}$ in the output, $q$ such that $a_q=1$, is adjusted to force ($p^3$) equation for $1/(1 \oplus D^2)$. More specifically, one bit $v_{kn+k+q}$ in the output, $q$ such that $a_q=1$, is adjusted such that $T_1(k) + cs(k) = 0$.

Before proving this corollary, we define the following sums:

$$R^{(e)}(k) = \sum_{q=-1}^{\lceil (kn+k)/2 \rceil - 1} v_{2q}$$

$$R^{(o)}(k) = \sum_{q=-1}^{\lfloor (kn+k)/2 \rfloor - 1} v_{2q+1}$$

where $v_{-1} = x_{-1}$ and $v_{-2} = x_{-2}$. Based on these sums, EQ14 can be written as $$T_2(k) = a^{(e)}(k) R^{(e)}(k) + a^{(o)}(k) R^{(o)}(k). \tag{EQ 21}$$

Now we prove Corollary 2.7 by induction. First, for $k=0$, we have:

Condition 1(0): $ns_1(0) = R^{(e)}(1) a^{(o)}(1) + R^{(o)}(1) a^{(e)}(1)$,
Condition 2(0): $ns_2(0) = R^{(e)}(1) a^{(e)}(1) + R^{(o)}(1) a^{(o)}(1)$,
Condition 3(0): $T_2(1) = cs_2(1) = ns_2(0)$.

To see these, let's consider one of the above conditions, let's say Condition 1(0). Now, based on the hypotheses of this corollary we have $$cs_2(0) = [r_1 x_{-2} + r_2 x_{-1}]_2, \tag{EQ 22}$$

$$ns_1(0) = cs_2(0) + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}. \tag{EQ 23}$$

Therefore, substituting (EQ 22) into (EQ 23) we obtain $$ns_1(0) = r_1 x_{-2} + r_2 x_{-1} + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}$$

Thus, Condition 1(0) follows from Corollary 2.5 and the definition of sums $R^{(o)}(k)$ and $R^{(e)}(k)$. Now let's assume Conditions 1–3 hold for some non-negative integer $k$. Therefore, we have Condition1(k): $ns_1(k)=R^{(e)}(k+1)a^{(o)}(k+1)+R^{(o)}(k+1)a^{(e)}(k+1)$, Condition2(k): $ns_2(k)=R^{(e)}(k+1)a^{(e)}(k+1)+R^{(o)}(k+1)a^{(o)}(k+1)$, Condition3(k): $T_2(k+1)=CS_2(k+1)=ns_2(k)$.

Next, we show Conditions 1–3 will hold for k+1.

(Proof of Condition 1(k+1)) Based on the hypotheses of this corollary we have $$ns_1(k+1) = cs_2(k+1) + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}.$$

However, we have $cs_2(k+1)=ns_2(k)$, therefore, using Condition 2(k), the above equality becomes $$ns_1(k') = R^{(e)}(k')a^{(e)}(k') + R^{(o)}(k')a^{(o)}(k') + \qquad \text{(EQ 24)}$$
$$r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}$$

where k'=k+1. Using Corollary 2.5, (EQ 24) simplifies to $ns_1(k+1)=R^{(e)}(k+2)a^{(o)}(k+2)+R^{(o)}(k+2)a^{(e)}(k+2)$.

We omit the proof of Condition 2(k+1) since it is very similar to the above. Condition 3(k+1), then, follows directly from definitions.

Therefore, the finite state machine of Corollary 2.7 satisfies EQ12 for all $k \geq 0$. Finally, we note that $ns_1(k)$ can be computed by $$ns_1(k) = T_1(k) + r_2 \sum_{\substack{t \in \{0,\ldots,n\} \\ t \text{ odd}}} v_{kn+k+t} + r_1 \sum_{\substack{t \in \{0,\ldots,n\} \\ t \text{ even}}} v_{kn+k+t}$$

since $T_1(k)+cs_2(k)=0$.

The next finite state machine is yet another way of forcing EQ11 based on Lemma 2.

COROLLARY 2.8: If n is even, then EQ11 can be forced at the output of a $1/(1 \oplus D^2)$ precoder by a finite state machine having at time k:

$$cs(0) = (cs_1(0), cs_2(0)) = ([r_1 x_{-1} + r_2 x_{-2}]_2, [r_1 x_{-2} + r_2 x_{-1}]_2),$$

$$cs(k) = (ns_1(k-1), ns_2(k-1)) \text{ for } k > 0,$$

$$ns(k) = (ns_1(k), ns_2(k)) \text{ (for } k \geq 0,)$$

$$ns_1(k) = cs_2(k) + r_1 \sum_{\substack{t \in S(k) \\ t \text{ odd}}} v_t + r_2 \sum_{\substack{t \in S(k) \\ t \text{ even}}} v_t,$$

$$ns_2(k) = cs_2(k) + r_2 \sum_{\substack{t \in S(k) \\ t \text{ odd}}} v_t + r_1 \sum_{\substack{t \in S(k) \\ t \text{ even}}} v_t,$$

$$\underline{v} = \text{Output} = (v_{kn+k}, v_{kn+k+1}, \ldots, v_{kn+k+n}),$$

where $S(k)=\{kn+k, kn+k+1, \ldots, kn+k+n\}$, and one bit $v_{kn+k+q}$ in the output, q such that $a_q=1$, is adjusted to force $(p^3)$ equation for $1/(1 \oplus D^2)$. More specifically, one bit $v_{kn+k+q}$ in the output, q such that $a_q=1$, is adjusted such that $T_1(k)+cs_2(k)=0$ if k is even,
$T_1(k)+cs_1(k)=0$ if k is odd.

To prove this corollary use an induction.

LEMMA 3: If more than one parity equation is to hold at the output of a $1/(1 \oplus D)$ or $1/(1 \oplus D^2)$ precoder, then
 (a) each parity equation would produce a pre-precoder-parity equations of its own on the input of the precoder, and the input must satisfy all these conditions simultaneously, furthermore,
 (b) if the parity equations are independent, then their $(p^3)$ equations are independent, and a distinct control integer must be chosen in order to force each $(p^3)$ equation.

PROOF:

Part (a) is a straightforward generalization of Lemmas 1 and 2, and part (b) follows from the fact that the map from $\{i_1 i_2 \ldots i_r\}$ to $\{a_0, a_1, \ldots, a\}$ is invertible for both $1/(1 \oplus D)$ and $1/(1 \oplus D^2)$. We remark that we can always start with a set of independent parity equations by eliminating dependent equations one by one.

What is claimed is:

1. A communication system for coding an input signal to provide gain, said system comprising:
 an encoder having an input and an output for generating a coded sequence $v_0 v_1 v_2 \ldots$ from the input signal that satisfies the condition $$\sum_{q=0}^{n} a_q v_{kn+k+q} + a^{(e)}(k) \sum_{q=-1}^{[(kn+k)/2]-1} v_{2q} + a^{(o)}(k) \sum_{q=-1}^{[(kn+k)/2]-1} v_{2q+1} = 0$$

so that consecutive blocks of a $1/(1 \oplus D^2)$ precoder output sequence $x_0 x_1 x_2 \ldots$ has a pre-selected parity structure, the input of the encoder coupled to receive the input signal;
 a $1/(1 \oplus D^2)$ precoder for generating the precoded sequence, the precoder having an input and an output, the input of the precoder coupled to the output of the encoder;
 a partial response channel having an input and an output for transforming signals to provide a channel sequence, the input of the partial response channel coupled to the output of the precoder for receiving the precoded sequence;
 a detector having an input and an output for producing an output sequence, the input of the detector coupled to the output of the partial response channel to receive the channel sequence; and
 a decoder having an input and an output for regenerating the input signal from a signal output by the detector, the input of the decoder coupled to the output of the detector.

2. The system of claim 1, wherein the precoder is a $1/(1 \oplus D)$ precoder, and the encoder generates a coded sequence $v_0 v_1 v_2 \ldots$ from the input signal that satisfies the condition $$\sum_{q=0}^{n} a_q v_{kn+k+q} + r \sum_{q=-1}^{kn+k-1} v_q = 0.$$

3. The system of claim 1, wherein the partial response channel includes a filter coupled to receive the precoded sequence $x_0 x_1 x_2 \ldots$, a noise source and an adder coupled to sum the output of the filter and the noise source.

4. The system of claim 1, wherein the detector is a Viterbi detector.

5. The system of claim 1, wherein the decoder performs the inverse function of the encoder on an input string.

6. The system of claim 1, wherein the detector is a noise-predictive Viterbi detector.

7. The system of claim 1, wherein the encoder further comprises:
 a serial-to-parallel converter having an input and a plurality of outputs for converting a serial string into parallel bits, the input of the serial-to-parallel converter coupled to receive the input signal;
 a code generator having an input and an output for producing at least one code bit, the input of the code generator coupled to at least one of the plurality of outputs of the serial-to-parallel converter; and a parallel-to-serial converter having a plurality of inputs and an output for generating a serial string from parallel bits, the plurality of inputs of the parallel-to-serial converter coupled to at least one of the plurality of outputs of the serial-to-parallel converter, and the output of the code generator.

8. The system of claim 7, wherein the encoder receives a serial string of eight bits and outputs a serial string of nine bits, the serial-to-parallel converter is a one-to-eight converter, the parallel-to-serial converter is a nine-to-one converter, and the outputs of the serial-to-parallel converter are coupled to respective inputs of the parallel-to-serial converter, and the code generator is coupled to one of the plurality of inputs of the parallel-to-serial converter.

9. The system of claim 8, wherein the code generator produces an output bit using the equation $v_8(k)=v_0(k)+v_3(k)+v_4(k)+v_7(k)+(a^{(e)}(k)cs_1(k)+a^{(o)}(k)cs_2(k))$.

10. The system of claim 8, wherein the code generator is coupled to the output of the precoder and produces an output bit using the equation $v_8(k)=v_0(k)+v_3(k)+v_4(k)+v_7(k)+x_{kn+k-2}$.

11. The system of claim 7, wherein the encoder receives a serial string of eight bits and outputs a serial string of ten bits, the serial-to-parallel converter is a one-to-eight converter, the parallel-to-serial converter is a ten-to-one converter, and the outputs of the serial-to-parallel converter are coupled to respective inputs of the parallel-to-serial converter, and the code generator is coupled to two of the plurality of inputs of the parallel-to-serial converter.

12. The system of claim 11, wherein the code generator produces a first output bit using the equation $v_8(k)=v_0(k)+v_4(k)+cs_1^{(1)}(k)$, and a second output bit using the equation $v_9(k)=v_1(k)+v_5(k)+cs_2^{(2)}(k)$.

13. The system of claim 11, wherein the code generator is coupled to the output of the precoder and produces a first output bit using the equation $v_8(k)=v_0(k)+v_4(k)+x_{kn+k-2}$, and a second output bit using the equation $v_9(k)=v_1(k)+v_5(k)+x_{kn+k-1}$.

14. The system of claim 2, wherein the encoder further comprises:

a serial-to-parallel converter having an input and a plurality of outputs for converting a serial string into parallel bits, the input of the serial-to-parallel converter coupled to receive the input signal;

a first code generator having a plurality of inputs and a plurality of outputs for encoding according to a first encoding scheme, each of the plurality of inputs of the first code generator coupled to a respective one of the plurality of outputs of the serial-to-parallel converter;

a second code generator having a plurality of inputs and an output for encoding according to a second encoding scheme, the plurality of inputs of the second code generator coupled to the plurality of outputs of the first code generator; and a parallel-to-serial converter having a plurality of inputs and an output for generating a serial string from parallel bits, the plurality of inputs of the parallel-to-serial converter coupled to at least one of the plurality of outputs of the first code generator, and the output of the second code generator.

15. The system of claim 14, wherein the second code generator produces an output bit using the equation $v_{10}(k)=cs(k)+v_0(k)+v_2(k)+v_4(k)+v_6(k)+v_8(k)$.

16. The system of claim 14, wherein the second code generator is coupled to the output of the precoder and produces a first output bit using the equation $v_{10}(k)=v_0(k)+v_2(k)+v_4(k)+v_8(k)+x_{kn+k-1}$.

17. An apparatus for generating a coded sequence from an input signal such that after precoding with a precoder said sequence satisfies a set of parity equations, said apparatus comprising:

a serial-to-parallel converter having an input and a plurality of outputs for converting a serial string into parallel bits, the input of the serial-to-parallel converter coupled to receive the input signal;

a code generator having an input and an output for producing at least one code bit $v_{kn+k+q}$ in the coded sequence that is adjusted to satisfy the condition $$\sum_{q=0}^{n} a_q v_{kn+k+q} + a^{(e)}(k) \sum_{q=-1}^{[(kn+k)/2]-1} v_{2q} + a^{(0)}(k) \sum_{q=-1}^{[(kn+k)/2]-1} v_{2q+1} = 0,$$

the input of the code generator coupled to at least one of the plurality of outputs of the serial-to-parallel converter; and a parallel-to-serial converter having a plurality of inputs and an output for generating a serial string from parallel bits, the plurality of inputs of the parallel-to-serial converter coupled to at least one of the plurality of outputs of the serial-to parallel converter, and the output of the code generator.

18. The apparatus of claim 17, wherein the apparatus receives a serial string of eight bits and outputs a serial string of nine bits, the serial-to-parallel converter is a one-to-eight converter, the parallel-to-serial converter is a nine-to-one converter, and the outputs of the serial-to-parallel converter are coupled to respective inputs of the parallel-to-serial converter, and the code generator is coupled to one of the plurality of inputs of the parallel-to-serial converter.

19. The apparatus of claim 17, wherein the code generator produces an output bit using the equation $v_8(k)=v_0(k)+v_3(k)+v_4(k)+v_7(k)+(a^{(e)}(k)cs_1(k)+a^{(0)}(k)cs_2(k))$.

20. The apparatus of claim 17, wherein the code generator is coupled to the output of the precoder and produces an output bit using the equation $v_8(k)=v_0(k)+v_3(k)+v_4(k)+v_7(k)+x_{kn+k-2}$.

21. The apparatus of claim 17, wherein the apparatus receives a serial string of eight bits and outputs a serial string of ten bits, the serial-to-parallel converter is a one-to-eight converter, the parallel-to-serial converter is a ten-to-one converter, and the outputs of the serial-to-parallel converter are coupled to respective inputs of the parallel-to-serial converter, and the code generator is coupled to two of the plurality of inputs of the parallel-to-serial converter.

22. The apparatus of claim 17, wherein the code generator produces a first output bit using the equation $v_8(k)=v_0(k)+v_4(k)+cs_1^{(1)}(k)$, and a second output bit using the equation $v_9(k)=v_1(k)+v_5(k)+cs_2^{(2)}(k)$.

23. The apparatus of claim 17, wherein the code generator is coupled to the output of the precoder and produces a first output bit using the equation $v_8(k)=v_0(k)+v_4(k)+x_{kn+k-2}$, and a second output bit using the equation $v_9(k)=v_1(k)+v_5(k)+x_{kn+k-1}$.

24. An apparatus for generating a code sequence from an input signal such that after precoding with a precoder said sequence satisfies a set of parity equations, said apparatus comprising:

a serial-to-parallel converter having an input and a plurality of outputs for converting a serial string into parallel bits, the input of the serial-to-parallel converter coupled to receive the input signal;

a first code generator having a plurality of inputs and a plurality of outputs for encoding according to a first encoding scheme, each of the plurality of inputs of the first code generator coupled to a respective one of the plurality of outputs of the serial-to-parallel converter;

a second code generator having a plurality of inputs and an output for encoding according to a second encoding scheme, the plurality of inputs of the second code generator coupled to the plurality of outputs of the first code generator; and a parallel-to-serial converter having a plurality of inputs and an output for generating a serial string from parallel bits, the plurality of inputs of the parallel-to-serial converter coupled to at least one of the plurality of outputs of the first code generator, and the output of the second code generator.

25. The apparatus of claim 24, wherein the second code generator produces an output bit using the equation $v_{10}(k) = cs(k) + v_0(k) + v_2(k) + v_4(k) + v_6(k) + v_8(k)$.

26. The apparatus of claim 24, wherein the second code generator is coupled to the output of the precoder and produces a first output bit using the equation $v_{10}(k) = v_0(k) + v_2(k) + v_4(k) + v_8(k) + x_{kn+k-1}$.

27. A method for encoding an input string for input to a partial response channel such that after precoding an encoded input string satisfies a set of parity equations, said method comprising the steps of:

converting the input string into parallel bits;

generating at least one coded bit $v_{kn+k+q}$ from the parallel bits, the coded bit $v_{kn+k+q}$ adjusted to satisfy the condition $$\sum_{q=0}^{n} a_q v_{kn+k+q} + a^{(e)}(k) \sum_{q=-1}^{[(kn+k)/2]-1} v_{2q} + a^{(0)}(k) \sum_{q=-1}^{[(kn+k)/2]-1} v_{2q+1} = 0;$$

and converting at least one of the parallel bits and the coded bit $v_{kn+k+q}$ into a serial string of bits.

28. The method of claim 27 wherein the step of generating a coded bit further comprises the step of adding to the serial string of bits at least one bit produced from the parallel bits such that the parallel bits and said produced bit have a pre-selected parity structure after preceding.

29. The method of claim 27 wherein the step of generating a coded bit generates the coded bit using the equation $$v_8(k) = v_0(k) + v_3(k) + v_4(k) + v_7(k) + (a^{(e)}(k)cs_1(k) + a^{(o)}(k)cs_2(k)).$$

30. The method of claim 27 wherein the step of generating a coded bit generates the coded bit by receiving a signal from a precoder and using the equation $v_8(k) = v_0(k) + v_3(k) + v_4(k) + v_7(k) + x_{kn+k-2}$.

31. The method of claim 27 wherein the step of generating a coded bit generates a first output bit using the equation $v_8(k) = v_0(k) + v_4(k) + cs_1^{(1)}(k)$, and a second output bit using the equation $v_9(k) = v_1(k) + v_5(k) + cs_2^{(2)}(k)$.

32. The method of claim 27 wherein the step of generating a coded bit generates the coded bit by receiving a signal from a precoder, and producing a first output bit using the equation $v_8(k) = v_0(k) + v_4(k) + x_{kn+k-2}$, and a second output bit using the equation $v_9(k) = v_1(k) + v_5(k) + x_{kn+k-1}$.

33. The method of claim 27 wherein the step of generating a coded bit further comprise the step of:

generating at least one coded bit from the parallel bits, the coded bit adjusted to satisfy the condition $$\sum_{q=0}^{n} a_q v_{kn+k+q} + r \sum_{q=-1}^{kn+k-1} v_q = 0.$$

34. The method of claim 33 wherein the coded bit is generated using the equation $v_{10}(k) = cs(k) + v_0(k) + v_2(k) + v_4(k) + v_6(k) + v_8(k)$.

35. The method of claim 33, wherein the step of generating a coded bit includes receiving a signal from a precoder, and producing a first output bit using the equation $v_{10}(k) = v_0(k) + v_2(k) + v_4(k) + v_8(k) + x_{kn+k-1}$.

36. The method of claim 27 further including the steps of:

generating the coded bit from a serial stream of bits;

adding the generated code bit to the serial stream of bits; and outputting an encoded stream of bits that includes the code bit and the serial stream of bits.

37. An apparatus for generating a code sequence such that after precoding said sequence satisfies a set of parity equations, said apparatus comprising:

a first code generator having an input and a plurality of outputs for producing a 9/10 code, the input of the first code generator coupled to receive an input sequence; and a second code generator having a plurality of inputs and an output for producing a coded bit according to the equation $v_{10}(k) = cs(k) + v_0(k) + v_2(k) + v_4(k) + v_6(k) + v_8(k)$, the plurality of inputs of the second code generator coupled to the plurality of outputs of the first code generator.

\* \* \* \* \*